US012694166B2

(12) United States Patent　　　　(10) Patent No.:　US 12,694,166 B2
Bandi et al.　　　　　　　　　　　(45) Date of Patent:　　Jul. 28, 2026

(54) SYSTEM, METHOD, AND, COMPUTER PRODUCTS FOR ONE-DIMENSIONAL HYDROLOGIC AND HYDRAULIC MODELING OF STREAM NETWORKS

(71) Applicant: Michael Baker International, Inc., Pittsburgh, PA (US)

(72) Inventors: Kranti Kumar Bandi, Bridgeville, PA (US); Brendan Allen Barnes, Woodbury, MN (US)

(73) Assignee: Michael Baker International, Inc., Moon Township, PA (US)

( * ) Notice: Subject to any disclaimer, the term of this patent is extended or adjusted under 35 U.S.C. 154(b) by 1107 days.

(21) Appl. No.: 17/747,712

(22) Filed: May 18, 2022

(65) Prior Publication Data

US 2023/0376641 A1　　Nov. 23, 2023

(51) Int. Cl.
　　*G06F 30/13*　　　(2020.01)
　　*G06F 17/11*　　　(2006.01)
　　*G06F 17/15*　　　(2006.01)

(52) U.S. Cl.
　　CPC .............. *G06F 30/13* (2020.01); *G06F 17/11* (2013.01); *G06F 17/15* (2013.01)

(58) Field of Classification Search
　　CPC ......... G06F 30/00; G06F 30/13; G06F 17/11; G06F 17/15
　　USPC ...................................................... 703/1, 9, 6
　　See application file for complete search history.

(56) References Cited

U.S. PATENT DOCUMENTS

| | | | |
|---|---|---|---|
| 12,141,918 B1 * | 11/2024 | Betten | ...................... G06T 17/05 |
| 2014/0229420 A1 * | 8/2014 | Green | ................... G06Q 50/16 |
| | | | 706/52 |

OTHER PUBLICATIONS

Petikas, Ioannis et al., "A Novel Method for the Automatic Extraction of Quality Non-Planar River Cross-Sections from Digital Elevation Models", Dec. 17, 2020, Water 2020, 12, MPDI. (Year: 2020).*
Flanagin, Maik et al., "Hydraulic Splines A Hybrid Approach to Modeling River Channel Geometries", 2007, Computing in Science & Engineering, IEEE CS and AIP. (Year: 2007).*

(Continued)

*Primary Examiner* — Cedric Johnson
(74) *Attorney, Agent, or Firm* — The Webb Law Firm

(57) ABSTRACT

A method, system, and computer program product is provided for obtaining stream network data including a stream network elevation for one or more streams, a plurality of centerlines, and flow information in the stream network, generating a discrete stream points corresponding to a point of a regular interval along a centerline of each stream in the stream network, automatically generating a plurality of normal vectors originating from a unique starting point selected from the plurality of discrete stream points, generating a plurality of non-intersecting cross-sections in the stream network, each non-intersecting cross-section comprising a curve based on the flow information and originating from the normal vectors, each non-intersecting cross-section configured to avoid intersection with each point in its own cross-section while avoiding intersection with points in each of the other non-intersecting cross-sections, and automatically adjusting the plurality of cross-sections to satisfy a hydraulic modeling requirement.

17 Claims, 17 Drawing Sheets

(56)             References Cited

OTHER PUBLICATIONS

Dormand et al., "A family of embedded Runge-Kutta formulae," Journal of Computational and Applied Mathematics, 1980, vol. 6, No. 1, pp. 19-26.

O'Callaghan et al., "The Extraction of Drainage Networks from Digital Elevation Data," Computer Vision, Graphics, and Image Processing, 1984, vol. 28, pp. 323-344.

Petikas et al., "A Novel Method for the Automatic Extraction of Quality Non-Planar River Cross-Sections from Digital Elevation Models," Water, 2020, vol. 12, No. 3553, pp. 1-27.

* cited by examiner

Contour Map

Elevation Map

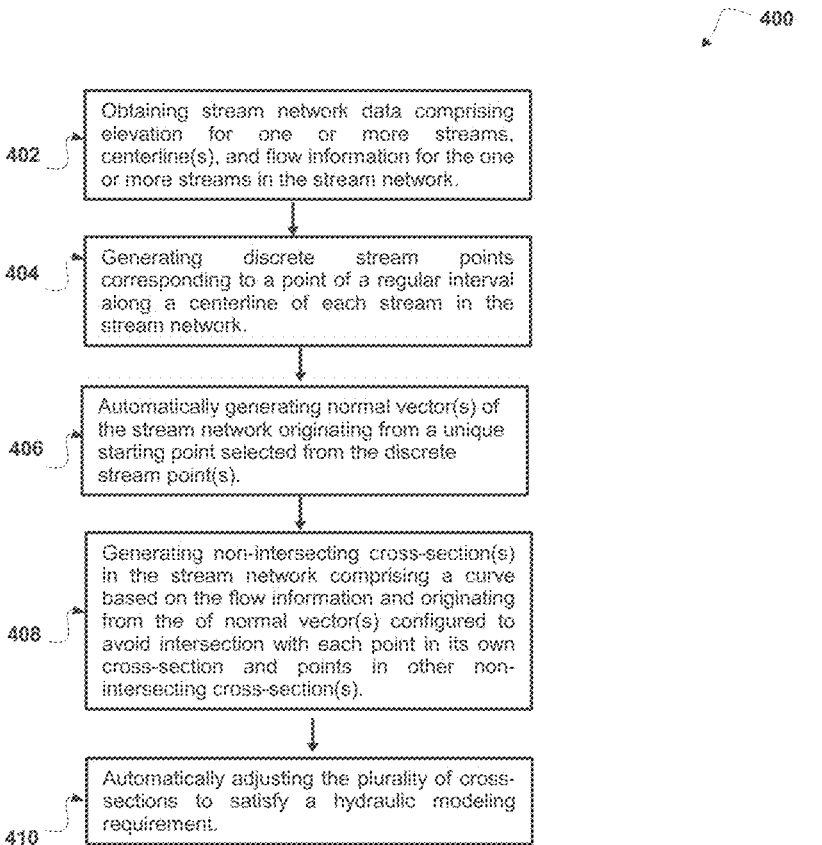

400

402 — Obtaining stream network data comprising elevation for one or more streams, centerline(s), and flow information for the one or more streams in the stream network.

404 — Generating discrete stream points corresponding to a point of a regular interval along a centerline of each stream in the stream network.

406 — Automatically generating normal vector(s) of the stream network originating from a unique starting point selected from the discrete stream point(s).

408 — Generating non-intersecting cross-section(s) in the stream network comprising a curve based on the flow information and originating from the of normal vector(s) configured to avoid intersection with each point in its own cross-section and points in other non-intersecting cross-section(s).

410 — Automatically adjusting the plurality of cross-sections to satisfy a hydraulic modeling requirement.

FIG. 4

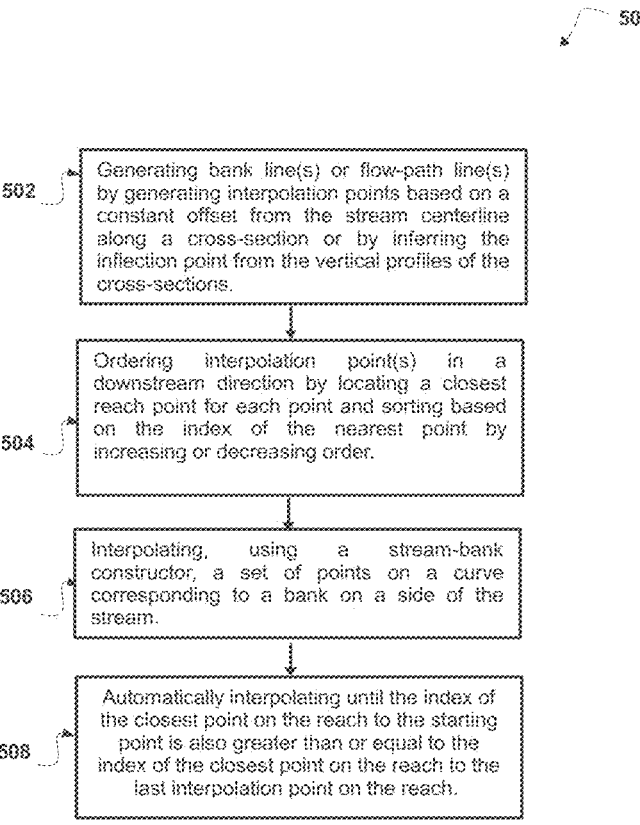

500

502 — Generating bank line(s) or flow-path line(s) by generating interpolation points based on a constant offset from the stream centerline along a cross-section or by inferring the inflection point from the vertical profiles of the cross-sections.

504 — Ordering interpolation point(s) in a downstream direction by locating a closest reach point for each point and sorting based on the index of the nearest point by increasing or decreasing order.

506 — Interpolating, using a stream-bank constructor, a set of points on a curve corresponding to a bank on a side of the stream.

508 — Automatically interpolating until the index of the closest point on the reach to the starting point is also greater than or equal to the index of the closest point on the reach to the last interpolation point on the reach.

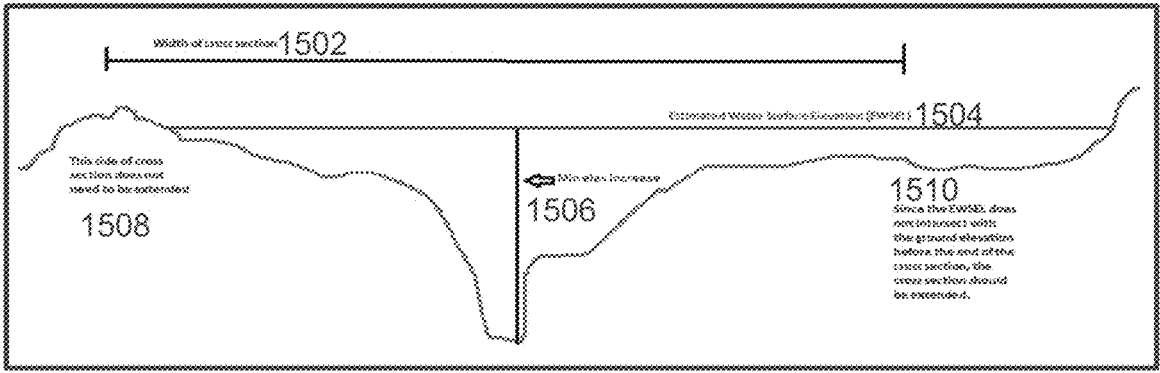
FIG. 15A
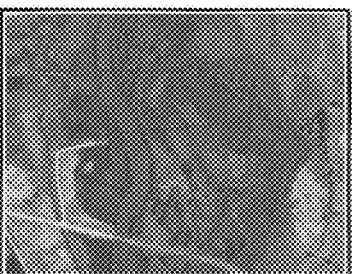
FIG. 15B                    FIG. 15C

SYSTEM, METHOD, AND, COMPUTER PRODUCTS FOR ONE-DIMENSIONAL HYDROLOGIC AND HYDRAULIC MODELING OF STREAM NETWORKS

BACKGROUND

Field

This disclosure relates generally to non-limiting embodiments, systems, methods, and computer products for automatically generating one-dimensional hydraulic models of a stream network, generating and determining cross-sections which avoid intersections, automatically adjusting cross-sections for a flood plain, generating bank lines, and flow-path lines by means of interpolation.

Technical Considerations

A floodplain is a land area (e.g., land adjacent to a river or a stream) that is susceptible to being inundated periodically (e.g., occasionally) by flood waters from any source. Due to the high value of land and structures built adjacent to a stream or river, it is desirable to maximize and develop in the floodplain area. Generally, an area of land adjacent to a stream which stretches from the banks of the stream channel to the base of the enclosing valley walls, a floodplain (e.g., floodway, bottomlands, etc.) experiences flooding during periods of high discharge. Often new development is restricted within a flood plain unless it is demonstrated that the proposed encroachment will not result in a rise in a flood (e.g., the 100-year, 500-year flood, a base flood, etc.) with an elevation of more than a designated height (e.g., a 1 foot rise).

In order to identify a floodplain, an examination of the areas through which floodwater will flow are used to make a determination of ground elevations and obstructions to flow (such as vegetation, buildings, bridges, and other development) for floodplain areas. Accurate data associated with the channel geometry and changes in the floodplain are obtained and used from ground surveys, aerial photography, or topographic maps. A cross-section (e.g., a graphical line graph depicting a side view of the landscape) of the stream and the floodplain is developed for a particular point along the stream to show the features of a stream, such as hills and valleys, or depths, such as the depth of a river. Also, cross-sections may include accurate information about the size and geometry of the channel, the shape of the floodplain, and the changes in the elevation of the ground. As an example, referring to FIGS. 1A and 1B, cross-sections of a hill (in this case a hilly area) show contour lines that can be used to determine the height of the land and influence the flow of water. For example, in FIG. 1A, contour lines describing the elevation of a hill is shown, and in FIG. 1B the elevation of the hill is shown.

However, repetitive and manual work is still required for hydraulic modeling and for the engineering of cross-sections, banks, and flow-paths that also must support requirements and customizations for each study, stream, or reach related to a floodplain. Since the approach to cross-sections has been to make them angled perpendicular to the direction of flow of the river and also planar, such planar cross-sections (e.g., manual or otherwise) perpendicular to the stream centerline is problematic and cannot produce usable cross-sections except in places where the stream is very straight. In further view of the above, planar cross-sections formed perpendicular to the stream, generally intersect the centerline in more than one place, intersect with other cross-sections on the reach, and/or are not perpendicular to the flow in the over banks. In other examples, the bank lines and overbank lines form self-intersections and entire networks of streams may be impossible to determine when junctions and/or parallel flow with combined floodplains exist. Lastly, manual steps are required to correct such deficiencies, and when manual efforts are required, they significantly slow floodplain analysis, limit adjustments, and are generally inefficient and less accurate.

SUMMARY

According to non-limiting embodiments or aspects, provided is a computer-implemented method for generating a one-dimensional hydraulic model of a stream network, comprising: obtaining, on a computing system with a plurality of processors, data including a stream network elevation for one or more streams, a plurality of centerlines, and flow information for the one or more streams in the stream network; generating, on the computing system, a plurality of discrete stream points, wherein each point corresponds to a point of a regular interval along a centerline of each stream in the stream network; automatically generating, on the computing system, a plurality of normal vectors of the stream network, each normal vector originating from a unique starting point selected from the plurality of discrete stream points; generating, on the computing system, a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of the other non-intersecting cross-sections; and automatically adjusting, on the computing system, the plurality of cross-sections to satisfy a hydraulic modeling requirement.

In non-limiting embodiments or aspects, the computer-implemented method, wherein the curve corresponding to each cross-section passes through a unique point $p_j$ on the centerline of the stream network, and generating the cross-sections further comprises: generating the curve for each non-intersecting cross-section by finding a solution, for each point $p_j$, to the equation:

$$\frac{dy_j}{dt} = y'_j = \frac{f}{\|f\|}, \text{ where } y_j(0) = p_j;$$

wherein the vector field $f(\gamma)$ includes a sum over a plurality of points $p_i$ forming the centerline that are near to the curve based on a spatial indexing structure, and is computed by the equation:

$$f(y) = \sum_i \frac{n_i g_i}{d_i^2},$$

and determining $n_i$, $g_i$, and $d_i$ from:

$$n_i = \begin{bmatrix} \cos\left(\theta_i - \frac{\pi}{2}\right) \\ \sin\left(\theta_i - \frac{\pi}{2}\right) \end{bmatrix},$$

such that $\theta_i = \text{a tan 2}(\Delta p_{i,1}, \Delta p_{i,0})$ and $\Delta p_i = p_{i+1} - p_{i-1}$, and wherein $$g_i = \begin{cases} 1 & (u_i \times v_i)_2 \geq 0 \\ -1 & \text{otherwise} \end{cases}, \text{ when}$$

$$u_i = \begin{bmatrix} y_0 - p_{i,0} \\ y_1 - p_{i,0} \\ 0 \end{bmatrix}, v_i = \begin{bmatrix} -n_{i,1} \\ n_{i,0} \\ 0 \end{bmatrix}, \text{ and } d_i = \|y - p_i\|;$$

and determining the normal vector in any of the discrete points of any stream or reach, based on the angle formed in the change between a first point and a second point, wherein the discrete points change with respect to the angle of the stream.

In some non-limiting embodiments or aspects, the computer-implemented method, wherein the curve is generated by combining two solutions in an order of left to right in a direction of the stream, wherein one solution provides a left side of the cross-section, and a second solution provides a right side of the cross-section, and wherein the curve comprises a non-planar cross-section.

The computer-implemented method, wherein a hydraulic modeling requirement is adjusted to extend a cross-section to satisfy a minimum elevation increase, to reduce the spacing between cross-sections per reach, or to configure the cross-section extent within a predetermined threshold of the width of a floodplain at an intersection of the cross-section and the floodplain.

The computer-implemented method, wherein generating the plurality of non-intersecting cross-sections, comprises any combination of: generating the plurality of cross-sections perpendicular to the flow direction, to intersect the centerline of the stream perpendicular to a flow in a local curvature of the stream; generating the cross-section to include an orientation with respect to a flow-path in the overbanks defined by a global curvature of the streams; and generating the cross-section to extend to within a threshold width of a floodplain; and hydraulic modeling of the cross-section extent within a predetermined threshold of the width of the floodplain at the intersection of the cross-section and the floodplain.

The computer-implemented method, wherein generating the plurality of discrete stream points in the stream network, comprises: determining each stream point to correspond to a discrete portion of the stream at a point along the stream centerline.

The computer-implemented method, wherein flow-paths are generated in the center of the area of the cross-section profile positioned between the stream centerline and either of the left and right overbanks.

The computer-implemented method, wherein the discrete stream points comprise an order, wherein the order includes moving in a direction from upstream to downstream or downstream to upstream.

The computer-implemented method, wherein the spacing between curves can be optimized by adjusting a distance between two or more curves based on specified conditions in at least one of the stream, the stream network, and a user preference.

The computer-implemented method, wherein cross-sections can be systematically refined to satisfy a predetermined combination of hydraulic modeling requirements, to meet at least one of: a minimum elevation increase, a reduction in the spacing between cross-sections, a match of a predetermined number of cross-sections per reach, or any combination thereof.

The computer-implemented method, comprising: in response to determining a cross-section has been generated to satisfy a threshold length, clipping the cross-section to approximate the length of a floodplain extent, wherein the floodplain extent is based on a user-specified polygon, based on an approximate floodplain polygon that was automatically generated for the stream network, or determined by inferring the extent using digital terrain information and a user-specified maximum cross-section vertical height.

The computer-implemented method, wherein the overbank line comprises one or more interpolation points on the cross-section between a bank section and an end of the cross-section, and wherein the interpolation points are derived from a user-specified parameter, within a range starting along a bank line and ending at the cross-section.

The computer-implemented method, wherein the overbank line is defined to enable the generation of a smooth, variable offset curve with no self-intersections.

The computer-implemented method, further comprising: generating a bank line or a flow-path line by generating a plurality of interpolation points based on a constant offset from the stream centerline along a cross-section or by inferring the inflection point from the vertical profiles of the cross-sections; ordering the plurality of interpolation points in a downstream direction by locating a closest reach point for each point and sorting based on the index of the nearest point, wherein each interpolation point is sorted by increasing or decreasing order; interpolating, using a stream-bank constructor, a set of points on a curve corresponding to a bank on a side of the stream; and automatically interpolating until the index of the closest point on the reach to the starting point is also greater than or equal to the index of the closest point on the reach to the last interpolation point on the reach.

The computer-implemented method, wherein generating bank lines includes assigning bank interpolation points on the cross-sections where a channel ends and an overbank starts for both a left and a right over bank, and wherein generating flow-path lines includes generating flow-path interpolation points on the cross-section between a bank station and an end of the cross-section derived from a predetermined threshold between 0.0 and 1.0, wherein 0.0 identifies a location along the bank line and 1.0 is the location along the ends of the cross-section.

The computer-implemented method, wherein the constructor, $\gamma' = \beta v - \alpha \eta$, $\gamma(0) = q_0$, is configured to determine a variable offset from the stream centerline along the generated cross-sections, wherein interpolating comprises the constructor that is configured to select points along the bank in a downstream direction as it nears the correct offset distance, moves either closer to the stream to match the correct offset distance, or further away from the stream to match the correct offset distance, wherein the functions for $\alpha$ and $\beta$ are defined in terms of a target offset distance D and an interpolation tolerance h, such that $$\Phi(y) = \frac{\sum_j \frac{\delta(q_i)}{\|y - q_i\|}}{\sum_j \frac{1}{\|y - 1_j\|}}, \text{ where } s = \delta(y) - \phi(y), h = 1, \text{ and}$$

$$\alpha = \frac{2}{1 + e^{-s/h}} - 1, \beta = e^{-\left(\frac{s}{h}\right)^2}.$$

A system, comprising at least one processor configured to: obtain data including a stream network elevation for one or more streams, a plurality of centerlines, and flow information for the one or more streams in the stream network; generate a plurality of discrete stream points, wherein each point corresponds to a point of a regular interval along a centerline of each stream in the stream network; automatically generate a plurality of normal vectors of the stream network, each normal vector originating from a unique starting point selected from the plurality of discrete stream points; generate a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of the other non-intersecting cross-sections; and automatically adjust the plurality of cross-sections to satisfy a hydraulic modeling requirement.

A computer program product for tuning a one-dimensional hydraulic model of a stream network, comprising at least one non-transitory computer-readable medium including one or more instructions that, when executed by at least one processor, cause the at least one processor to: obtain data including a stream network elevation for one or more streams, a plurality of centerlines, and flow information for the one or more streams in the stream network; generate a plurality of discrete stream points, wherein each point corresponds to a point of a regular interval along a centerline of each stream in the stream network; automatically generate a plurality of normal vectors of the stream network, each normal vector originating from a unique starting point selected from the plurality of discrete stream points; generate a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of the other non-intersecting cross-sections; and automatically adjust the plurality of cross-sections to satisfy a hydraulic modeling requirement.

Other non-limiting embodiments or aspects will be set forth in the following numbered clauses:

Clause 1: A computer-implemented method for generating a one-dimensional hydraulic model of a stream network, comprising: obtaining, on a computing system with a plurality of processors, data including a stream network elevation for one or more streams, a plurality of centerlines, and flow information for the one or more streams in the stream network; generating, on the computing system, a plurality of discrete stream points, wherein each point corresponds to a point of a regular interval along a centerline of each stream in the stream network; automatically generating, on the computing system, a plurality of normal vectors of the stream network, each normal vector originating from a unique starting point selected from the plurality of discrete stream points; generating, on the computing system, a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of the other non-intersecting cross-sections; and automatically adjusting, on the computing system, the plurality of cross-sections to satisfy a hydraulic modeling requirement.

Clause 2: The computer-implemented method of clause 1, wherein the curve corresponding to each cross-section passes through a unique point $p_j$ on the centerline of the stream network, and generating the cross-sections further comprises: generating the curve for each non-intersecting cross-section by finding a solution, for each point $p_j$, to the equation:

$$\frac{dy_j}{dt} = y_j' = \frac{f}{\|f\|},$$

where $\gamma_j(0) = p_j$; wherein the vector field $f(\gamma)$ includes a sum over a plurality of points $p_i$ forming the centerline that are near to the curve based on a spatial indexing structure, and is computed by the equation:

$$f(y) = \sum_i \frac{n_i g_i}{d_i^2},$$

and determining $$n_i = \begin{bmatrix} \cos\left(\theta_i - \frac{\pi}{2}\right) \\ \sin\left(\theta_i - \frac{\pi}{2}\right) \end{bmatrix},$$

such that $\theta_i = \text{atan } 2 \ (\Delta p_{i,1}, \ \Delta p_{i,0})$ and $\Delta p_i = p_{i+1} - p_{i-1}$, and wherein $$g_i = \begin{cases} 1 & (u_i \times v_i)_2 \geq 0 \\ -1 & \text{otherwise} \end{cases}, \text{ when}$$

$$u_i = \begin{bmatrix} y_0 - p_{i,0} \\ y_1 - p_{i,0} \\ 0 \end{bmatrix}, v_i = \begin{bmatrix} -n_{i,1} \\ n_{i,0} \\ 0 \end{bmatrix}, \text{ and } d_i = \|y - p_i\|;$$

and determining the normal vector in any of the discrete points of any stream or reach in the stream network, based on the angle formed in the change between a first point and a second point, wherein the discrete points change with respect to the angle of the stream.

Clause 3: The computer-implemented method of clauses 1-2, wherein the curve is generated by combining two solutions in an order of left to right in a direction of the stream, wherein one solution provides a left side of the cross-section, and a second solution provides a right side of the cross-section, and the curve comprises a non-planar cross-section.

Clause 4: The computer-implemented method of clauses 1-3, wherein a hydraulic modeling requirement is adjusted to extend a cross-section to satisfy a minimum elevation increase, to reduce the spacing between cross-sections per reach, or to configure the cross-section extent within a predetermined threshold of the width of a floodplain at an intersection of the cross-section and the floodplain.

Clause 5: The computer-implemented method of clauses 1-4, wherein generating the plurality of non-intersecting cross-sections, comprises any combination of: generating at least one of the plurality of non-intersecting cross-sections perpendicular to the flow direction, to intersect the centerline of the stream perpendicular to a flow in a local curvature of the stream; generating at least one of the plurality of non-intersecting cross-sections to include an orientation with respect to a flow-path in the overbanks defined by a global curvature of the streams; generating at least one of the plurality of non-intersecting cross-sections to extend to within a threshold width of a floodplain; or hydraulic modeling of the cross-section extent for at least one of the plurality of non-intersecting cross-sections within a predetermined threshold of the width of the floodplain at the intersection of the cross-section and the floodplain.

Clause 6: The computer-implemented method of clauses 1-5, comprising: in response to determining a cross-section has been generated to satisfy a threshold length, clipping the cross-section to approximate the length of a floodplain extent, wherein the floodplain extent is based on a user-specified polygon, based on an approximate floodplain polygon that was automatically generated for the stream network, or determined by inferring the extent using digital terrain information and a user-specified maximum cross-section vertical height.

Clause 7: The computer-implemented method of clauses 1-6, further comprising: generating a bank line or a flow-path line by generating a plurality of interpolation points based on a constant offset from the stream centerline along a cross-section or by inferring an inflection point from one or more vertical profiles of the cross-sections; ordering the plurality of interpolation points in a downstream direction by locating a closest reach point for each point and sorting based on the index of the nearest point, wherein each interpolation point is sorted by increasing or decreasing order; interpolating, using a stream-bank constructor, a set of points on a curve corresponding to a bank on a side of the stream; and automatically interpolating until the index of the closest point on the reach to the starting point is also greater than or equal to the index of the closest point on the reach to the last interpolation point on the reach.

Clause 8: The computer-implemented method of clauses 1-7, wherein generating bank lines includes assigning bank interpolation points on the cross-sections where a channel ends and an overbank starts for both a left and a right over bank, and wherein generating flow-path lines includes generating flow-path interpolation points on the cross-section between a bank station and an end of the cross-section derived from a predetermined threshold between 0.0 and 1.0, wherein 0.0 identifies a location along the bank line and 1.0 is the location along the ends of the cross-section.

Clause 9: The computer-implemented method of clauses 1-8, wherein the constructor, $\gamma'=\beta v-\alpha\eta$, $\gamma(0)=q_0$, is configured to determine a variable offset from the stream centerline along the generated cross-sections, wherein interpolating comprises the constructor that is configured to select points along the bank in a downstream direction as it nears the correct offset distance, moves either closer to the stream to match the correct offset distance, or further away from the stream to match the correct offset distance, wherein the functions for a and @ are defined in terms of a target offset distance $\Phi$ and an interpolation tolerance h, such that $$\Phi(y) = \frac{\sum_j \frac{\delta(q_i)}{\|y - q_i\|}}{\sum_j \frac{1}{\|y - 1_j\|}}, \text{ where } s = \delta(y) - \phi(y), h = 1, \text{ and}$$

-continued $$\alpha = \frac{2}{1 + e^{-s/h}} - 1, \beta = e^{-\left(\frac{s}{h}\right)^2}.$$

Clause 10: A system for tuning a one-dimensional hydraulic model of a stream network, comprising: one or more processors programmed and/or configured to: obtain data including a stream network elevation for one or more streams, a plurality of centerlines, and flow information for the one or more streams in the stream network; generate a plurality of discrete stream points, wherein each point corresponds to a point of a regular interval along a centerline of each stream in the stream network; automatically generate a plurality of normal vectors of the stream network, each normal vector originating from a unique starting point selected from the plurality of discrete stream points; generate a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of the other non-intersecting cross-sections; and automatically adjust the plurality of cross-sections to satisfy a hydraulic modeling requirement.

Clause 11: The system of clauses 10, wherein the curve corresponding to each cross-section passes through a unique point $p_j$ on the centerline of the stream network, and the one or more processors configured to: generate the curve for each non-intersecting cross-section by finding a solution, for each point $p_j$, to the equation: $d\gamma_j/dt=$ $$\frac{dy_j}{dt} = y'_j = \frac{f}{\|f\|},$$

where $\gamma_j(0)=p_j$; wherein the vector field $f(\gamma)$ includes a sum over a plurality of points $p_i$ forming the centerline that are near to the curve based on a spatial indexing structure, and is computed by the equation:

$$f(y) = \sum_i \frac{n_i g_i}{d_i^2},$$

and determining $n_i$, $g_i$, and $d_i$ from:

$$n_i = \begin{bmatrix} \cos\left(\theta_i - \frac{\pi}{2}\right) \\ \sin\left(\theta_i - \frac{\pi}{2}\right) \end{bmatrix},$$

such that $\theta_i=\text{atan } 2 \ (\Delta p_{i,1}, \ \Delta p_{i,0})$ and $\Delta p_i=p_{i+1}-p_{i-1}$, and wherein $$g_i = \begin{cases} 1 & (u_i \times v_i)_2 \geq 0 \\ -1 & \text{otherwise} \end{cases}, \text{ when}$$

$$u_i = \begin{bmatrix} y_0 - p_{i,0} \\ y_1 - p_{i,0} \\ 0 \end{bmatrix}, v_i = \begin{bmatrix} -n_{i,1} \\ n_{i,0} \\ 0 \end{bmatrix}, \text{ and } d_i = \|y - p_i\|;$$

and determine the normal vector in any of the discrete points of any stream or reach of the stream network, based on the angle formed in the change between a first point and a second point, wherein the discrete points change with respect to the angle of the stream.

Clause 12: The computer-implemented method of clauses 10-11, wherein the curve is generated by combining two solutions in an order of left to right in a direction of the stream, wherein one solution provides a left side of the cross-section, and a second solution provides a right side of the cross-section, and the curve comprises a non-planar cross-section.

Clause 13: The computer-implemented method of clauses 10-12, wherein a hydraulic modeling requirement is adjusted to extend a cross-section to satisfy a minimum elevation increase, to reduce the spacing between cross-sections per reach, or to configure the cross-section extent within a predetermined threshold of the width of a floodplain at an intersection of the cross-section and the floodplain.

Clause 14: The computer-implemented method of clauses 10-13, comprising any combination of: generating at least one of the plurality of non-intersecting cross-sections perpendicular to the flow direction, to intersect the centerline of the stream perpendicular to a flow in a local curvature of the stream; generating at least one of the plurality of non-intersecting cross-sections to include an orientation with respect to a flow-path in the overbanks defined by a global curvature of the streams; generating at least one of the plurality of non-intersecting cross-sections to extend to within a threshold width of a floodplain; or hydraulic modeling of the cross-section extent for at least one of the plurality of non-intersecting cross-sections within a predetermined threshold of the width of the floodplain at the intersection of the cross-section and the floodplain.

Clause 15: The system of clauses 10-14, wherein one or more processors are programmed and/or configured to: in response to determining a cross-section has been generated to satisfy a threshold length, clipping the cross-section to approximate the length of a floodplain extent, wherein the floodplain extent is based on a user-specified polygon, based on an approximate floodplain polygon that was automatically generated for the stream network, or determined by inferring the extent using digital terrain information and a user-specified maximum cross-section vertical height.

Clause 16: The system of clauses 10-15, wherein one or more processors are configured to: generate a bank line or a flow-path line by generating a plurality of interpolation points based on a constant offset from the stream centerline along a cross-section or by inferring an inflection point from one or more vertical profiles of the plurality of cross-sections; order the plurality of interpolation points in a downstream direction by locating a closest reach point for each point and sorting based on the index of the nearest point, wherein each interpolation point is sorted by increasing or decreasing order; interpolate using a stream-bank constructor, a set of points on a curve corresponding to a bank on a side of the stream; and automatically interpolate until the index of the closest point on the reach to the starting point is also greater than or equal to the index of the closest point on the reach to the last interpolation point on the reach.

Clause 17: The system of clauses 10-16, wherein the one or more processors are configured to: assign bank interpolation points on the cross-sections where a channel ends and an overbank starts for both a left and a right over bank, and wherein the one or more processors are configured to generate flow-path lines that include flow-path interpolation points generated on the cross-section between a bank station and an end of the cross-section derived from a predetermined threshold between 0.0 and 1.0, wherein 0.0 identifies the location along the bank line and 1.0 is a location along the ends of the cross-section.

Clause 18: The system of clauses 10-17, wherein the constructor, $\gamma = \beta v - \alpha \eta$, $\gamma(0) = q_0$, is configured to determine a variable offset from the stream centerline along the generated cross-sections, wherein interpolating comprises the constructor that is configured to select points along the bank in a downstream direction as it nears the correct offset distance, moves either closer to the stream to match the correct offset distance, or further away from the stream to match the correct offset distance, and wherein the functions for $\alpha$ and $\beta$ are defined in terms of a target offset distance D and an interpolation tolerance h, such that $$\Phi(y) = \frac{\sum_j \frac{\delta(q_i)}{\|y - q_i\|}}{\sum_j \frac{1}{\|y - 1_j\|}}, \text{ where } s = \delta(y) - \phi(y), h = 1, \text{ and}$$

$$\alpha = \frac{2}{1 + e^{-s/h}} - 1, \beta = e^{-\left(\frac{s}{h}\right)^2}.$$

Clause 19: A computer program product for tuning a one-dimensional hydraulic model of a stream network, comprising at least one non-transitory computer-readable medium including one or more instructions that, when executed by at least one processor, cause the at least one processor to: obtain data including a stream network elevation for one or more streams, a plurality of centerlines, and flow information for the one or more streams in the stream network; generate a plurality of discrete stream points, wherein each point corresponds to a point of a regular interval along a centerline of each stream in the stream network; automatically generate a plurality of normal vectors of the stream network, each normal vector originating from a unique starting point selected from the plurality of discrete stream points; generate a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of the other non-intersecting cross-sections; and automatically adjust the plurality of cross-sections to satisfy a hydraulic modeling requirement.

Clause 20: The computer program product of clause 19, wherein the curve corresponding to each cross-section passes through a unique point $p_j$ on the centerline of the stream network, and the one or more processors are configured to: generate the curve for each non-intersecting cross-section by finding a solution, for each point $p_j$, to the equation:

$$\frac{dy_j}{dt} = y'_j = \frac{f}{\|f\|},$$

where $\gamma_j(0) = p_j$; wherein the vector field $f(\gamma)$ includes a sum over a plurality of points $p_i$ forming the centerline that are near to the curve based on a spatial indexing structure, and is computed by the equation:

$$f(y) = \sum_i \frac{n_i g_i}{d_i^2},$$

and determining $n_i$, $g_i$, and $d_i$ from:

$$n_i = \begin{bmatrix} \cos\left(\theta_i - \frac{\pi}{2}\right) \\ \sin\left(\theta_i - \frac{\pi}{2}\right) \end{bmatrix},$$

such that $\theta_i = \text{atan } 2 (\Delta p_{i,1}, \Delta p_{i,0})$ and $\Delta p_i = p_{i+1} - p_{i-1}$, and wherein $$g_i = \begin{cases} 1 & (u_i \times v_i)_2 \geq 0 \\ -1 & \text{otherwise} \end{cases}, \text{ when } u_i = \begin{bmatrix} y_0 - p_{i,0} \\ y_i - p_{i,0} \\ 0 \end{bmatrix},$$

$$v_i = \begin{bmatrix} -n_{i,1} \\ n_{i,0} \\ 0 \end{bmatrix}, \text{ and } d_i = \|y - p_i\|;$$

and determine the normal vector in any of the discrete points of any stream or reach of the stream network, based on the angle formed in the change between a first point and a second point, wherein the discrete points change with respect to the angle of the stream.

Clause 21: The computer-implemented method of clauses 19-20, wherein the curve is generated by combining two solutions in an order of left to right in the direction of the stream, wherein one solution provides a left side of the cross-section, and a second solution provides a right side of the cross-section, and the curve comprises a non-planar cross-section.

Clause 22: The computer-implemented method of clauses 19-21, wherein a hydraulic modeling requirement is adjusted to extend a cross-section to satisfy a minimum elevation increase, to reduce the spacing between cross-sections per reach, or to configure the cross-section extent within a predetermined threshold of the width of a floodplain at an intersection of the cross-section and the floodplain.

Clause 23: The computer-implemented method of clauses 19-22, comprising any combination of: generating at least one of the plurality of non-intersecting cross-sections perpendicular to the flow direction, to intersect the centerline of the stream perpendicular to a flow in a local curvature of the stream; generating at least one of the plurality of non-intersecting cross-sections to include an orientation with respect to a flow-path in the overbanks defined by a global curvature of the streams; generating at least one of the plurality of non-intersecting cross-sections to extend to within a threshold width of a floodplain; or hydraulic modeling of the cross-section extent for at least one of the plurality of non-intersecting cross-sections within a predetermined threshold of the width of the floodplain at the intersection of the cross-section and the floodplain.

Clause 24: The system of clauses 19-23, wherein one or more processors are programmed and/or configured to: in response to determining a cross-section has been generated to satisfy a threshold length, clipping the cross-section to approximate the length of a floodplain extent, wherein the floodplain extent is based on a user-specified polygon, based on an approximate floodplain polygon that was automatically generated for the stream network, or determined by inferring the extent using digital terrain information and a user-specified maximum cross-section vertical height.

Clause 25: The system of clauses 19-24, wherein one or more processors are configured to: generate a bank line or a flow-path line by generating a plurality of interpolation points based on a constant offset from the stream centerline along a cross-section or by inferring an inflection point from one or more vertical profiles of the plurality of cross-sections; order the plurality of interpolation points in a downstream direction by locating a closest reach point for each point and sorting based on the index of the nearest point, wherein each interpolation point is sorted by increasing or decreasing order; interpolate using a stream-bank constructor, a set of points on a curve corresponding to a bank on a side of the stream; and automatically interpolate until the index of the closest point on the reach to the starting point is also greater than or equal to the index of the closest point on the reach to the last interpolation point on the reach.

Clause 26: The system of clauses 19-25, wherein the one or more processors are configured to: assign bank interpolation points on the cross-sections where a channel ends and an overbank starts for both a left and a right over bank, and wherein the one or more processors are configured to generate flow-path lines that include flow-path interpolation points generated on the cross-section between a bank station and an end of the cross-section derived from a predetermined threshold between 0.0 and 1.0, wherein 0.0 identifies the location along the bank line and 1.0 is the location along the ends of the cross-section.

Clause 27: The system of clauses 19-26, wherein the constructor, $\gamma = \beta v - \alpha \eta$, $\gamma(0) = q_0$, is configured to determine a variable offset from the stream centerline along the generated cross-sections, wherein interpolating comprises the constructor that is configured to select points along the bank in a downstream direction as it nears the correct offset distance, moves either closer to the stream to match the correct offset distance, or further away from the stream to match the correct offset distance, and wherein the functions for $\alpha$ and $\beta$ are defined in terms of a target offset distance $\Phi$ and an interpolation tolerance $h$, such that $$\Phi(y) = \frac{\sum_j \frac{\delta(q_i)}{\|y - q_i\|}}{\sum_j \frac{1}{\|y - 1_j\|}}, \text{ where } s = \delta(y) - \phi(y), h = 1, \text{ and}$$

$$\alpha = \frac{2}{1 + e^{-s/h}} - 1, \beta = e^{-\left(\frac{s}{h}\right)^2}.$$

These and other features and characteristics of the present disclosure, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

BRIEF DESCRIPTION OF THE DRAWINGS

Additional advantages and details are explained in greater detail below with reference to the non-limiting, exemplary embodiments that are illustrated in the accompanying schematic figures, in which:

FIG. 4 is a flow diagram for a method of one-dimensional hydraulic modeling in a stream network according to a non-limiting embodiment;

FIG. 5 is a flow diagram for a method of one-dimensional hydraulic modeling in a stream network according to a non-limiting embodiment;

FIGS. 15A-C are diagrams of cross-sections generated with the hydraulics tool according to some non-limiting embodiments or aspects;

DESCRIPTION OF THE PREFERRED EMBODIMENTS

Figure 1A:
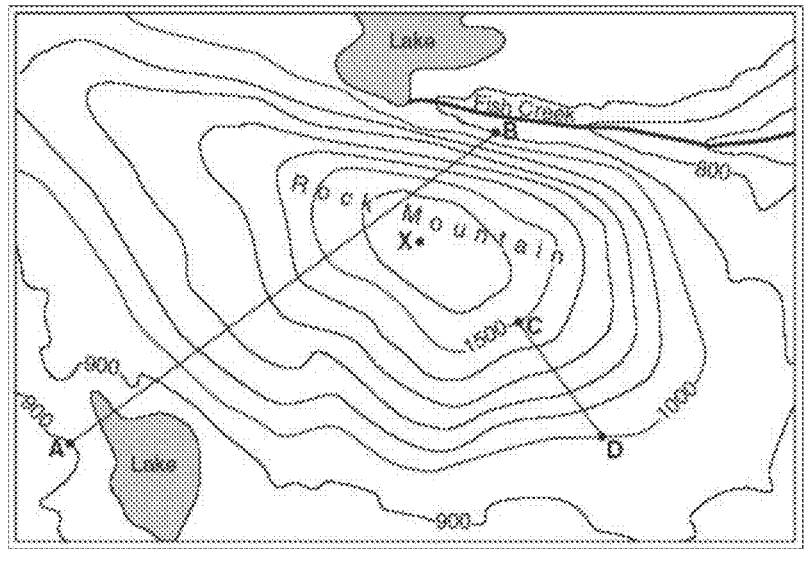
FIGS. 1A and 1B are exemplary diagrams showing an elevation in a geographic area.
Figure 1B:
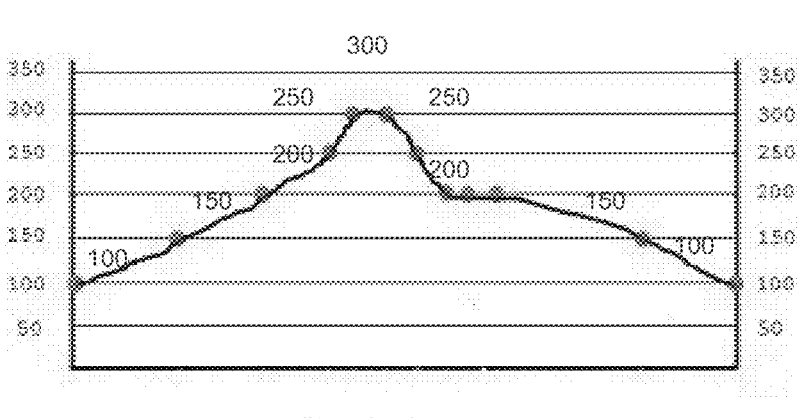

For purposes of the description hereinafter, the terms "end," "upper," "lower," "right," "left," "vertical," "horizontal," "top," "bottom," "lateral," "longitudinal," and derivatives thereof shall relate to the embodiments as they are oriented in the drawing figures. However, it is to be understood that the embodiments may assume various alternative variations and step sequences, except where expressly specified to the contrary. It is also to be understood that the specific devices and processes illustrated in the attached drawings, and described in the following specification, are simply exemplary embodiments or aspects of the invention.

Hence, specific dimensions and other physical characteristics related to the embodiments or aspects disclosed herein are not to be considered as limiting.

No aspect, component, element, structure, act, step, function, instruction, and/or the like used herein should be construed as critical or essential unless explicitly described as such. Also, as used herein, the articles "a" and "an" are intended to include one or more items and may be used interchangeably with "one or more" and "at least one." Furthermore, as used herein, the term "set" is intended to include one or more items (e.g., related items, unrelated items, a combination of related and unrelated items, and/or the like) and may be used interchangeably with "one or more" or "at least one." Where only one item is intended, the term "one" or similar language is used. Also, as used herein, the terms "has," "have," "having," or the like are intended to be open-ended terms. Further, the phrase "based on" is intended to mean "based at least partially on" unless explicitly stated otherwise.

As used herein, the term "HEC-RAS" is a one-dimensional steady flow hydraulic model that is generated to aid in channel flow analysis and floodplain determination. The results of the model can be applied in areas where floodplain management is a concern and can be used in flood studies.

As used herein, the term "communication" may refer to the reception, receipt, transmission, transfer, provision, and/or the like of data (e.g., information, signals, messages, instructions, commands, and/or the like). For one unit (e.g., a device, a system, a component of a device or system, combinations thereof, and/or the like) to be in communication with another unit means that the one unit is able to directly or indirectly receive information from and/or transmit information to the other unit. This may refer to a direct or indirect connection (e.g., a direct communication connection, an indirect communication connection, and/or the like) that is wired and/or wireless in nature. Additionally, two units may be in communication with each other even though the information transmitted may be modified, processed, relayed, and/or routed between the first and second unit. For example, a first unit may be in communication with a second unit even though the first unit passively receives information and does not actively transmit information to the second unit. As another example, a first unit may be in communication with a second unit if at least one intermediary unit processes information received from the first unit and communicates the processed information to the second unit.

As used herein, the term "computing device" may refer to one or more electronic devices configured to process data. A computing device may, in some examples, include the necessary components to receive, process, and output data, such as a processor, a display, a memory, an input device, a network interface, and/or the like. A computing device may be a mobile device. As an example, a mobile device may include a cellular phone (e.g., a smartphone or standard cellular phone), a portable computer, a wearable device (e.g., watches, glasses, lenses, clothing, and/or the like), a personal digital assistant (PDA), and/or other like devices. A computing device may also be a desktop computer or other form of non-mobile computer.

As used herein, the term "server" may refer to or include one or more computing devices that are operated by or facilitate communication and processing of multiple streams or portions of a stream, such as a junction, a bend, a sinuous region, or other feature of a stream network environment, such as the Internet, although it will be appreciated that communication may be facilitated over one or more public or private network environments and that various other arrangements are possible. Further, multiple computing devices (e.g., servers, devices, mobile devices, etc.) directly or indirectly communicating in the network environment may constitute a "system." Reference to "a server" or "a processor," as used herein, may refer to a previously-recited server and/or processor that is recited as performing a previous step or function, a different server and/or processor, and/or a combination of servers and/or processors. For example, as used in the specification and the claims, a first server and/or a first processor that is recited as performing a first step or function may refer to the same or different server and/or a processor recited as performing a second step or function.

As used herein, a stream is a body of water that flows on the earth's surface, the word stream is often used interchangeably with river, though rivers usually describe larger streams, and creeks, though creeks usually describe smaller streams, and as used herein, the term junction (e.g., stream junction, river junction, a confluence, crossing, intersection, etc.) occurs where two or more flowing bodies of water (e.g., two streams, rivers, etc.) join at a single point, such as a tributary or affluent, where a stream flows into a larger stream or mainstem (trunk or parent) of river or a lake. A larger, or parent, stream is called the main stem and where a tributary meets the mainstem is called the confluence, and drainage basin, also called a catchment area, or watershed, and comprises an area from which all precipitation flows to a single stream or set of streams.

As used herein, the term "bank", "stream bank", or "river bank" may refer to or include one or more of a bank in the land alongside a body of water. A stream bank or river bank is the terrain alongside the bed of a river, creek, or stream. A bank consists of the sides of the channel, between which the flow is confined, and the processes associated with rivers and streams, the deposits and landforms created by banks, and discharge great enough to fill the stream channel and overtop the banks. As used herein, the descriptive terms left bank and right bank refer to the perspective of an observer looking downstream.

As used herein, a stream channel is the physical confine or depression of a stream or river consisting of a bed and stream banks. Stream channels exist in a variety of geometries. Stream channel development is controlled by both water and sediment movement. The channel form is described in terms of geometry (plan, cross-sections, profile) enclosed by the materials of its bed and banks.

Stream modeling techniques have been attempted to generate the necessary data for a complete hydraulic model with little success. The approach of generating planar cross-sections perpendicular to the stream centerline fails to produce usable cross-sections (except in places where the stream is very straight) since the cross-section will tend to either intersect the centerline in more than one place, intersect other cross-sections on the reach, or fail to be perpendicular to the flow in the over banks.

Other methods rely on generating bank lines and overbank lines, which may have self-intersections, such that global self-intersection can cause the technique to fail, especially in sinuous reaches. Other methods may only generate cross-sections for a single reach and do not address an entire network of streams where there may be junctions and or parallel flow with combined floodplains.

Generating stream data also becomes inefficient when the model requires many changes and updates that are not automated, cannot be automated, and/or require iterations where the process must start over numerous times. For example, many streams or stream networks exist that may, due to a complex layout, be incapable of providing valuable modeling data. Still other systems are deficient and/or not capable of efficiently or accurately generating cross-sections, generating cross-sections of variable widths (e.g., a width that covers the extent necessary to capture the entire floodplain) while maintaining a perpendicular intersection, are deficient and/or not able to efficiently or accurately generate streamlines while guaranteeing the generation of non-self-intersecting bank lines, and/or are not able to efficiently or accurately generate streamlines while guaranteeing the generation of non-self-intersecting flow-path lines. Additionally, hydraulic systems may not be capable or not sufficient for accurately adjusting a streamline, such as cross-sections, flow-paths, bank-lines, and/or any combination thereof, in a hydraulic model while also guaranteeing the generation of non-self-intersecting flow-path lines, may require manual intervention, and may not provide an capability for adjusting, tuning, or changing hydraulic data and/or a hydraulic model.

Non-limiting embodiments or aspects of the disclosed subject matter are directed to improved systems, methods, and computer program products for delineating floodplains of varying and configurable stream networks, and comprise technical improvements and technical features for hydraulic modeling to automatically account for and/or manage the large variety and complexity of stream alignments and terrain morphologies, including modeling of parallel flow, flow to or from junctions, and flow through sinuous reaches in the stream networks must be carefully modeled to ensure accurate results. For example, in non-limiting embodiments or aspects, the disclosed subject matter provides systems, methods, and computer products for accurately and efficiently providing one-dimensional hydraulic modeling of a stream network, by obtaining, on a computing system with a plurality of processors, data including a stream network elevation for one or more streams, a plurality of centerlines, and flow information for the one or more streams in the stream network, generating a plurality of discrete stream points corresponding to a point along a centerline of the stream, the discrete stream points in correspondence with a regular interval along a centerline of each stream in the stream network, automatically generating a plurality of normal vectors of the stream network, each normal vector originating from a unique starting point selected from the plurality of discrete stream points, generating, on the computing system, a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of the other non-intersecting cross-sections; and automatically adjusting, on the computing system, the plurality of cross-sections to satisfy a hydraulic modeling requirement.

Additionally or alternatively, non-limiting embodiments or aspects of the disclosed subject matter are directed to improved systems, methods, and computer program products that provide improvements for accurately and efficiently generating bank lines or flow-path lines by generating a plurality of interpolation points based on a variable offset from the stream centerline along a cross-section or by inferring the inflection point from the vertical profiles of the cross-sections, improved ordering the plurality of interpolation points in a downstream direction by locating a closest reach point for each point and sorting each point based on the index of the nearest point, wherein each interpolation point is sorted by increasing or decreasing order, improved interpolating, using a stream-bank constructor, a set of points on a curve corresponding to a bank on a side of the stream, the stream-bank constructor, and automatically interpolating until the index of the closest point on the reach to the starting point, that is also greater than or equal to the index of the closest point on the reach to the last interpolation point on the reach.

Non-limiting embodiments or aspects of the disclosed subject matter are directed to a set of hydraulic and hydrologic codes that utilize geographic information system data to improve the creation of a one-dimensional hydraulic model. Additionally, the disclosed subject matter can be used to automate the creation of a one-dimensional hydraulic model for arbitrary collections of stream networks. The improvements herein are also operable to automate the creation of globally non-intersecting, non-planar cross-sections of all widths that cover the extent necessary to capture an entire floodplain, while still maintaining a perpendicular intersection with streamlines, and while still ensuring (e.g., guaranteeing) the generation of non-self-intersecting bank lines and flow-path lines, that can also accurately and efficiently, automate an adjustment of existing (e.g., previously created, etc.) globally non-intersecting, non-planar cross-sections of all widths that cover the extent necessary to capture the entire floodplain while maintaining a perpendicular intersection with streamlines and guaranteeing the generation of non-self-intersecting bank lines and flow-path lines.

Still further, the improvements herein include an interface (or interfaces) to more efficiently and accurately enter, adjust, and update floodplains. Moreover, non-limiting embodiments or aspects of the hydraulic modeling system disclosed herein, provide improvements for automatically generating a hydraulic model that can be used to automatically account for a large variety of stream alignments, and more accurately and efficiently determines, fully, or at least partially automatically, complex stream alignments, sinuous terrain morphology, and reaches, in a geographically selected, and configurable stream network, and/or the like. In addition, the improved hydraulic modeling system provides one dimensional modeling of parallel flow for streams, modeling of flow to or from junctions, and modeling of flow through very sinuous reaches of a stream network. The improved systems are also capable of more efficiently ensuring an improved hydraulic model and more accurately determining the improved hydraulic model for parallel flow for streams, flow to or from junctions, and flow through very sinuous reaches of a stream network.

For the purpose of illustration, in the following description, while the presently disclosed subject matter is described with respect to improved methods, systems, and computer program products for delineating floodplains of varying area and configurable stream networks, one skilled in the art will recognize that the disclosed subject matter is not limited to the illustrative embodiments or aspects. For example, the methods, systems, and computer program products described herein may be used with a wide variety of settings, such as generating a hydraulic model including the large variety and complexity of stream alignments and terrain morphology, one dimensional modeling of parallel flow, flow to or from junctions, and flow through very sinuous reaches, e.g., adjusting new or improved hydraulic models (e.g., adjusting parameters, etc.), evaluating performance of hydraulic models by isolating parameters of a model while performing testing (e.g., training the model for an aspect of an environment), adjusting in other contexts (e.g., flow detection, siting recommendation, etc.), and/or the like.

Figure 2:
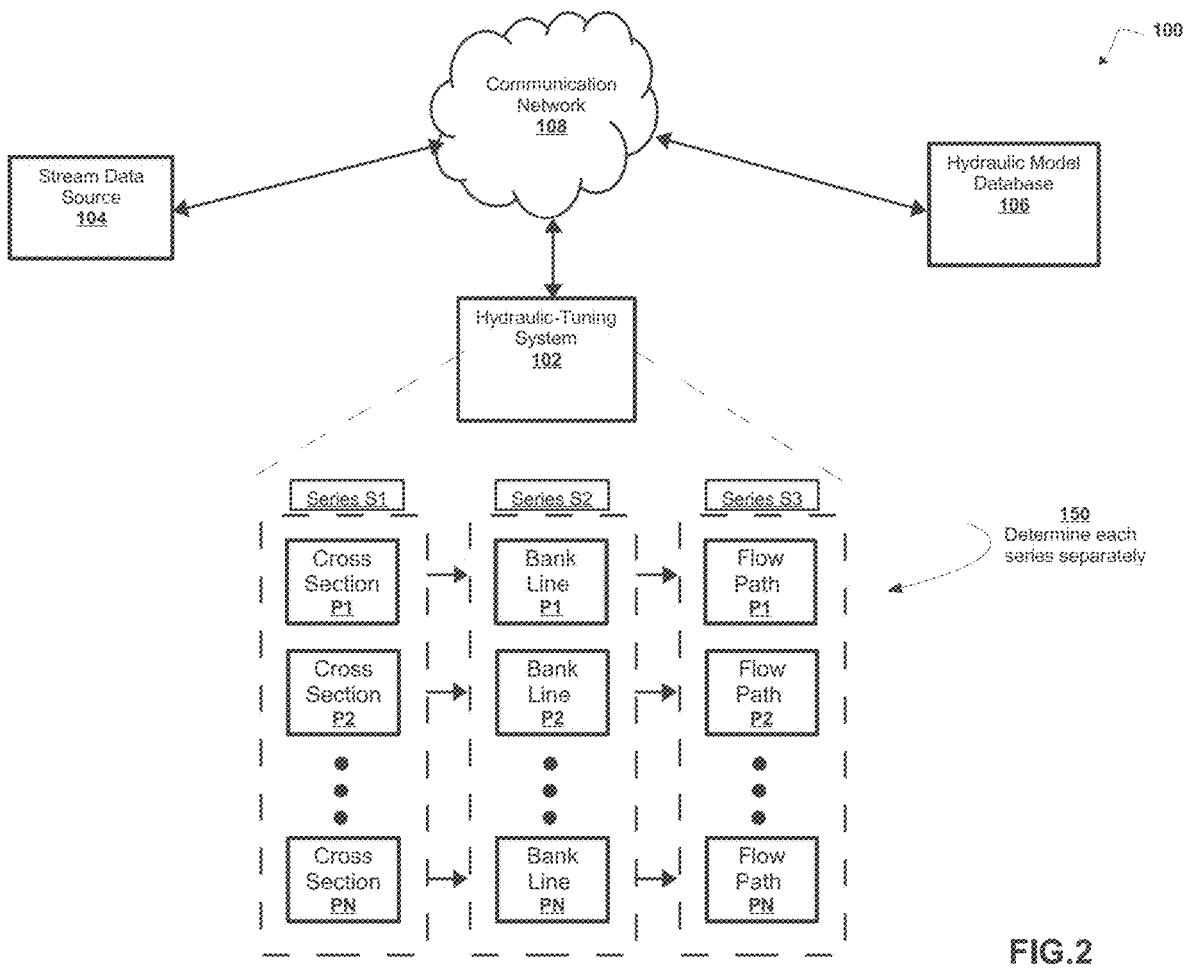
FIG. 2 is a diagram of a system for one-dimensional hydraulic modeling in a stream network according to a non-limiting embodiment.

FIG. 2 is a diagram of non-limiting embodiments or aspects of stream system 100, stream system 100 is a system for generating, determining, or adjusting a one-dimensional hydraulic model of a stream network according to a non-limiting embodiment. As shown in FIG. 2, stream system 100 includes hydraulics-tuning system 102 (e.g., one or more processors of hydraulics-tuning system 102, one or more computing systems of hydraulics-tuning system 102, one or more devices of hydraulics-tuning system 102, etc.), stream data source 104, and hydraulic model database 106 (e.g., one or more devices capable of receiving information of hydraulic model database 106, one or more devices for communicating information from hydraulic model database 106, one or more devices capable of storing information by hydraulic model database 106, etc.). FIG. 2 further illustrates grouping 150, representing that each series of cross-sections, bank lines, and flow paths may be determined separately by hydraulics-tuning system 102.

Referring now to FIG. 2, in some non-limiting embodiments or aspects, hydraulics-tuning system 102 may include one or more devices capable of receiving and/or storing information from stream data source 104 and/or communicating information to hydraulic model database 106. For example, hydraulics-tuning system 102 may include a computing device, such as a computer, a server, a group of servers, and/or other like devices. In some non-limiting embodiments or aspects, hydraulics-tuning system 102 may include at least one graphics processing unit (GPU), at least one central processing unit (CPU), and/or the like having highly parallel structure and/or multiple cores to enable more efficient and/or faster performance and/or adjusting of one-dimensional hydrologic and hydraulic data and/or models.

In some non-limiting embodiments or aspects, the hydraulics-tuning system 102 produces globally non-intersecting, nonplanar cross-sections for an entire stream network. For example, hydraulics-tuning system 102 solves an ordinary differential equation (ODE) for each cross-section. For first-order ODEs, the system is theoretically guaranteed to generate no cross-sections that will intersect with each other when the entire stream network is accounted for. Due to the approximate nature of numerical solvers and the optimizations of the algorithm, in some cases, cross-sections may brush up against each other and intersect, which can be fixed by increasing the accuracy of the solutions. To accomplish this with accuracy and without decreasing the cost of performance, parallel processing can be used as described below.

In non-limiting embodiments, stream data source 104 may include may include one or more devices capable of receiving and storing information from and/or communicating information to hydraulics-tuning system 102, hydraulic model database 106, and/or a display device. For example, stream data source 104 may include a computing device, such as a database management system, a cloud computer, a server, a group of servers, and/or other like devices. In some non-limiting embodiments or aspects, stream data source 104 may include at least one GPU, at least one CPU, and/or the like having highly parallel structure and/or multiple cores to enable more efficient and/or faster performance.

Figure 13:
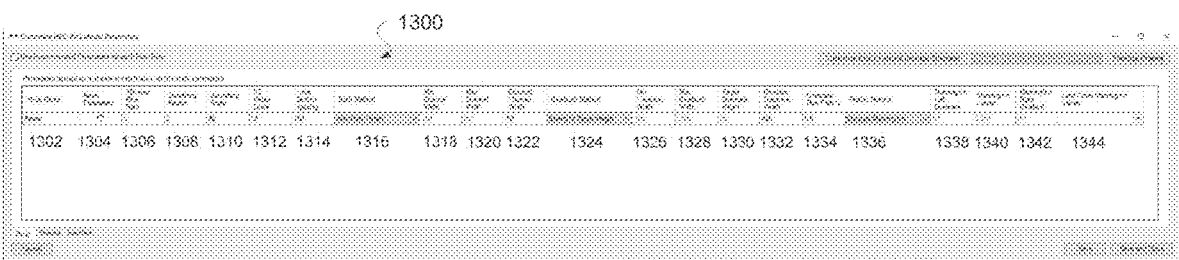
FIG. 13 shows an exemplary user interface with input parameters for generating hydraulic data according to a non-limiting embodiment.

In some non-limiting embodiments or aspects, a user interface as shown in FIG. 13 below, may be used to obtain information for generating and adjusting, and communicating instructions to one or more devices capable of receiving and storing information from and/or communicating information to hydraulics-tuning system 102, hydraulic model database 106, and/or a display device. For example, a user interface may be used to configure or program stream data source 104 for storing or use in a database management system, a cloud computer, a server, a group of servers, and/or other like devices. In non-limiting embodiments, the data source 104 may include configuring hydraulic data for testing or processing that may be performed and configured on at least one GPU, at least one CPU, and/or the like having highly parallel structure and/or multiple cores to enable more efficient and/or faster performance.

In non-limiting embodiments, hydraulics-tuning system 102 may generate a plurality of non-intersecting cross-sections in the stream network, a plurality of bank lines in the stream network, a plurality of flow-paths, and/or other stream network information. In some examples, a plurality of non-intersecting cross-sections in the stream network, a plurality of bank lines in the stream network, and a plurality of flow-paths are generated in parallel. Additionally, hydraulics-tuning system 102 generates the cross-sections, the bank lines, and the flow-paths in series, such that in S3, the plurality of non-intersecting cross-sections are generated in parallel, then in series S2, the plurality of bank lines are generated in parallel, then in series S3, a plurality of flow-paths. Continuing with the example, S1 feeds S2 and S3, and S2 feeds S3, for generating in the successive series. In non-limiting embodiments, stream data source 104 or one or more devices of stream data source 104 parallel series hydraulic data associated with a specified model (e.g., a model identifier, a named model, etc.) received from hydraulics-tuning system 102, and/or performs further processing in parallel or series based on conditions or constrains of the data.

In non-limiting embodiments, hydraulic model database 106 (or one or more devices of stream data source 104) may include one or more devices capable of receiving information from and/or communicating information to hydraulics-tuning system 102, or executing an HEC-RAS model. For example, hydraulic model database 106 may include a computing device, such as a computer, a server, a group of servers, and/or other like devices. In some non-limiting embodiments or aspects, hydraulic model database 106 may be in communication with a data storage device, which may be local or remote to hydraulic model database 106. In some non-limiting embodiments or aspects, hydraulic model database 106 may be capable of receiving information from, storing information in, communicating information to, or searching information stored in the data storage device. In non-limiting embodiments, communications between hydraulics-tuning system 102 and hydraulic model database 106 may include adjustments or updates to hydraulic model data or information, the adjustments or updates may be communicated in either direction, for example, such that hydraulic model database 106 makes improvements to hydraulic modeling data and transmits the hydraulic modeling data via communication network 108 to hydraulics-tuning system 102 for further refinements (e.g., updates, adjustments, etc.).

In some non-limiting embodiments or aspects, data storage, access, and modification can be made in parallel (e.g., in P1, P2, etc.). In this way, updates, tuning, and adjusting of stream objects can be made in parallel, in series, parallel series, and/or the like. For example, stream data is obtained and generated in a parallel series (series 1, series 2, etc.) for two or more of: 1) the generation of the cross-sections, 2)

generation of bank lines, or 3) generation of flow paths. Steps 1, 2, and 3 can be done in parallel to build a new model, however all 3 steps individually have the option of being computed in parallel, but this is not a requirement and they can also be computed on a dedicated processor (crypto processor, computing device, server, etc.), and may be generated separately, or may be generated separately to adjust, tune, update and/or the like, one of: 1) the generation of the cross-sections, 2) generation of bank lines, or 3) generation of flow paths.

In some non-limiting embodiments or aspects, communication network 108 includes one or more wired and/or wireless networks. For example, communication network 108 includes a cellular network (e.g., a long-term evolution (LTE) network, a third generation (3G) network, a fourth generation (4G) network, a fifth generation (5G) network, a code division multiple access (CDMA) network, etc.), a public land mobile network (PLMN), a local area network (LAN), a wide area network (WAN), a metropolitan area network (MAN), a telephone network (e.g., the public switched telephone network (PSTN)), a private network, an ad hoc network, an intranet, the Internet, a fiber optic-based network, a cloud computing network, and/or the like, and/or a combination of these or other types of networks.

The components of stream system 100 may communicate with each other via, for example, two communication networks of the same type as communication network 108. Networks may each be, for example, an internal wired network, a Virtual Private Network (VPN) or the Internet. Networks connecting components of stream system 100 may be the same or different networks. In alternative embodiments, all of the components of stream system 100 may communicate using a single network (not shown), such as the Internet. In other alternative embodiments, hydraulics-tuning system 102 may utilize more than two networks (not shown). For example, stream system 100 may be replaced by a first network for communication between hydraulics-tuning system 102 and stream data source 104, and a second network for communication between hydraulics-tuning system 102 and hydraulic model database 106. In this example, stream data source 104 may not be connected with the second network, and hydraulic model database 106 may not be connected with the first network.

The number and arrangement of systems and/or devices shown in FIG. 2 are provided as an example. There may be additional systems and/or devices; fewer systems and/or devices; different systems and/or devices; and/or differently arranged systems and/or devices than those shown in FIG. 2. Furthermore, two or more systems or devices shown in FIG. 2 may be implemented within a single system or device, or a single system or device shown in FIG. 2 may be implemented as multiple, distributed systems or devices. Additionally or alternatively, a set of systems (e.g., one or more systems) or a set of devices (e.g., one or more devices) of stream system 100 may perform one or more functions described as being performed by another set of systems or another set of devices of stream system 100.

Figure 3:
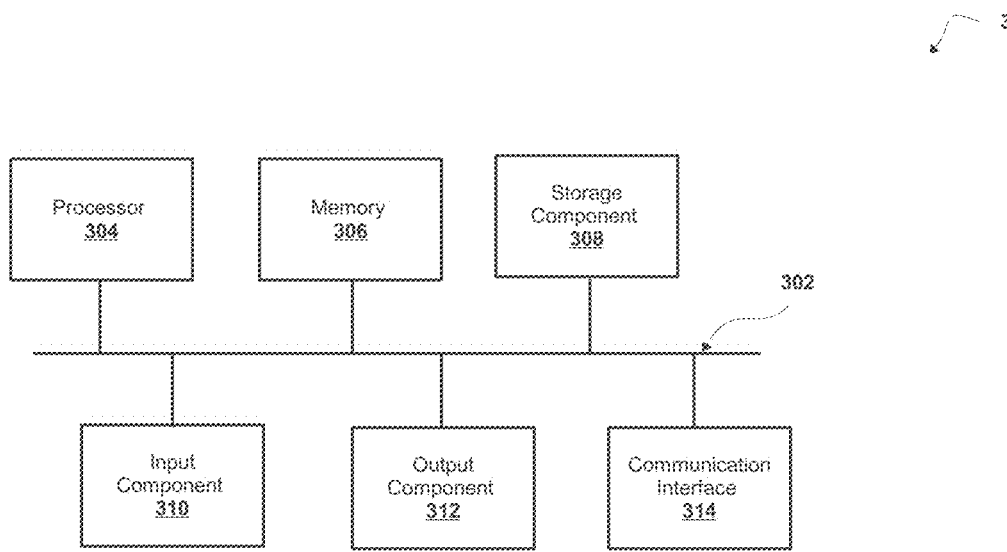
FIG. 3 illustrates example components of a device used in connection with non-limiting embodiments.

Referring now to FIG. 3, shown is a diagram of example components of device 300 according to non-limiting embodiments. Device 300 may correspond to hydraulics-tuning system 102, stream data source 104, and hydraulic model database 106 in FIG. 2 as an example. In some non-limiting embodiments, such systems or devices may include at least one device 300 and/or at least one component of device 300. The number and arrangement of components shown are provided as an example. In some non-limiting embodiments, device 300 may include additional components, fewer components, different components, or differently arranged components than those shown in FIG. 2. Additionally, or alternatively, a set of components (e.g., one or more components) of device 300 may perform one or more functions described as being performed by another set of components of device 300.

As shown in FIG. 3, device 300 may include bus 302, processor 304, memory 306, storage component 308, input component 310, output component 312, and communication interface 314. Bus 302 may include a component that permits communication among the components of device 300. In some non-limiting embodiments, processor 304 may be implemented in hardware, firmware, or a combination of hardware and software. For example, processor 304 may include a processor (e.g., a central processing unit (CPU), a graphics processing unit (GPU), an accelerated processing unit (APU), etc.), a microprocessor, a digital signal processor (DSP), and/or any processing component (e.g., a field-programmable gate array (FPGA), an application-specific integrated circuit (ASIC), etc.) that can be programmed to perform a function. Memory 306 may include random access memory (RAM), read only memory (ROM), and/or another type of dynamic or static storage device (e.g., flash memory, magnetic memory, optical memory, etc.) that stores information and/or instructions for use by processor 304.

With continued reference to FIG. 3, storage component 308 may store information and/or software related to the operation and use of device 300. For example, storage component 308 may include a hard disk (e.g., a magnetic disk, an optical disk, a magneto-optic disk, a solid state disk, etc.) and/or another type of computer-readable medium. Input component 310 may include a component that permits device 300 to receive information, such as via user input (e.g., a touch screen display, a keyboard, a keypad, a mouse, a button, a switch, a microphone, etc.). Additionally, or alternatively, input component 310 may include a sensor for sensing information (e.g., a global positioning system (GPS) component, an accelerometer, a gyroscope, an actuator, a Lidar, a camera, an image sensor, etc.). Output component 312 may include a component that provides output information from device 300 (e.g., a display, a speaker, one or more light-emitting diodes (LEDs), etc.). Communication interface 314 may include a transceiver-like component (e.g., a transceiver, a separate receiver and transmitter, etc.) that enables device 300 to communicate with other devices, such as via a wired connection, a wireless connection, or a combination of wired and wireless connections. Communication interface 314 may permit device 300 to receive information from another device and/or provide information to another device. For example, communication interface 314 may include an Ethernet interface, an optical interface, a coaxial interface, an infrared interface, a radio frequency (RF) interface, a universal serial bus (USB) interface, a Wi-Fi® interface, a cellular network interface, and/or the like.

Device 300 may perform one or more processes described herein. Device 300 may perform these processes based on processor 304 executing software instructions stored by a computer-readable medium, such as memory 306 and/or storage component 308. A computer-readable medium may include any non-transitory memory device. A memory device includes memory space located inside of a single physical storage device or memory space spread across multiple physical storage devices. Software instructions may be read into memory 306 and/or storage component 308 from another computer-readable medium or from another device via communication interface 314. When executed, software instructions stored in memory 306 and/or storage component 308 may cause processor 304 to perform one or more processes described herein. Additionally, or alternatively, hardwired circuitry may be used in place of or in combination with software instructions to perform one or more processes described herein. Thus, embodiments described herein are not limited to any specific combination of hardware circuitry and software. The term "programmed or configured," as used herein, refers to an arrangement of software, hardware circuitry, or any combination thereof on one or more devices.

Referring now to FIG. 4, shown is a process for generating a one-dimensional hydraulic model of a stream network according to non-limiting embodiments. The steps shown in FIG. 4 are for example purposes only. It will be appreciated that additional, fewer, different, and/or a different order of steps may be used in non-limiting embodiments.

As shown in FIG. 4, at step 402, process 400 may include obtaining stream network data comprising elevation for one or more streams, centerlines, and flow information for the one or more streams in the stream network. For example, in some non-limiting embodiments, hydraulics-tuning system 102 obtains data including a stream network elevation for a stream network in the geographic area, a dataset comprising a plurality of centerlines for a plurality of one or more streams in the stream network, and flow information related to a flow-path of the one or more streams in the stream network.

In non-limiting embodiments, the data required for a one-dimensional hydraulic model of a stream network can include or consist of a digital terrain model (DTM), the centerlines of the stream network, flow information for each part of the network, wall-friction information for each part of the network (e.g., in the form of Manning's N values of land cover data, etc.), stream bank lines, overbank flow-path lines, and cross-sections along the stream's perpendicular to the flow. Generally, the DTM, stream centerlines, and land cover data are readily available for the modeler to use. In the improved systems, methods, and computer program products, described herein, flow change nodes are developed for stream centerlines using hydrology codes based on the determined state and region specific flow rate. For example, stream data source 104 stores, receives, or transmits the hydraulic modeling data via communication network 108 to hydraulics-tuning system 102 for further refinements (e.g., updates, adjustments, etc.).

In some non-limiting embodiments or aspects, hydraulics-tuning system 102 transmits stream data for generating bank lines, flow-paths, and cross-sections including a DTM, the centerlines of the stream network, flow information for each part of the network, wall-friction information for each part of the network, stream bank lines, overbank flow-path lines, and cross-sections along the stream's perpendicular to the flow over banks. Hydraulics-tuning system 102 is programmed or configured to generate flow-paths and bank lines without including or containing any local or global self-intersections.

The model geometry must satisfy requirements to ensure accurate results. For example, in non-limiting embodiments, the cross-sections must cover the entire floodplain width and should not be wide. In non-limiting embodiments, the cross-sections should be placed at regular intervals and should not intersect with their self or with other cross-sections in the network (e.g., neighboring or within a threshold distance, etc.). In some non-limiting embodiments or aspects, the cross-sections are placed perpendicular to the flow direction (i.e., the cross-sections cross the stream centerlines and flow-paths in the over banks at right angles).

Figure 6:
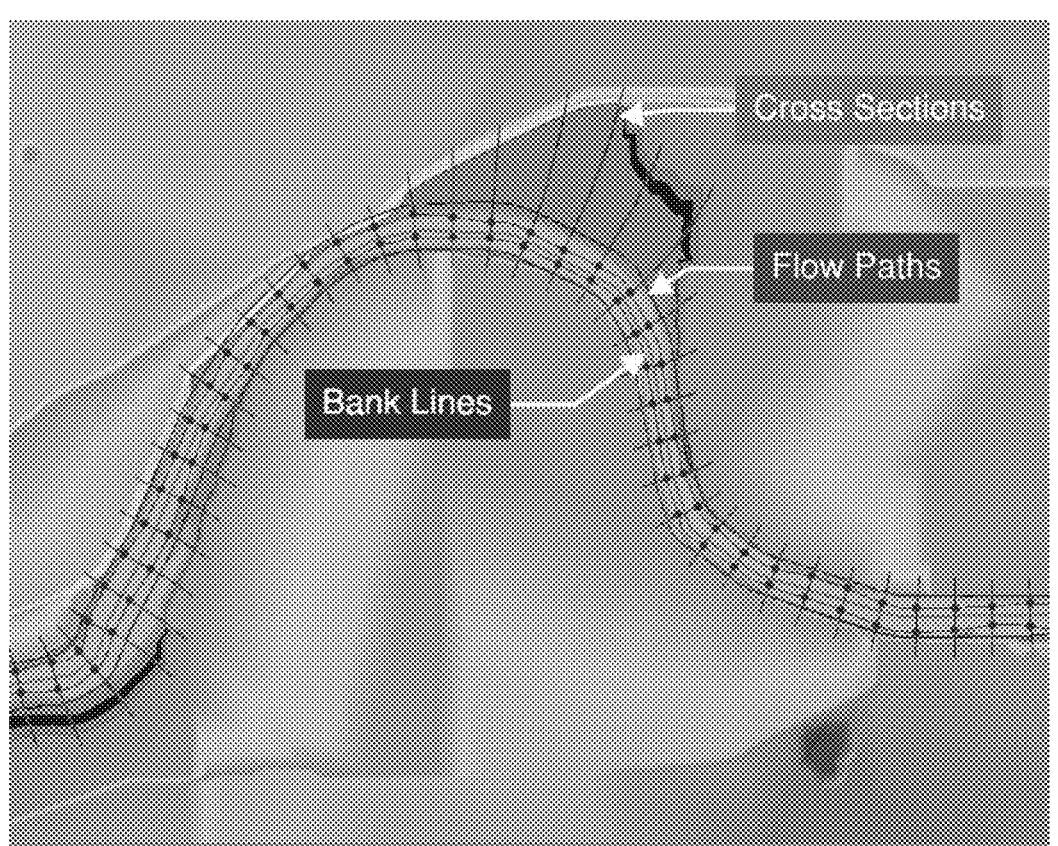
FIG. 6 is a diagram of a stream channel and floodplain with a series of cross-section lines, bank lines, and flow-path lines along a channel in a stream network according to a non-limiting embodiment.
Figure 7:
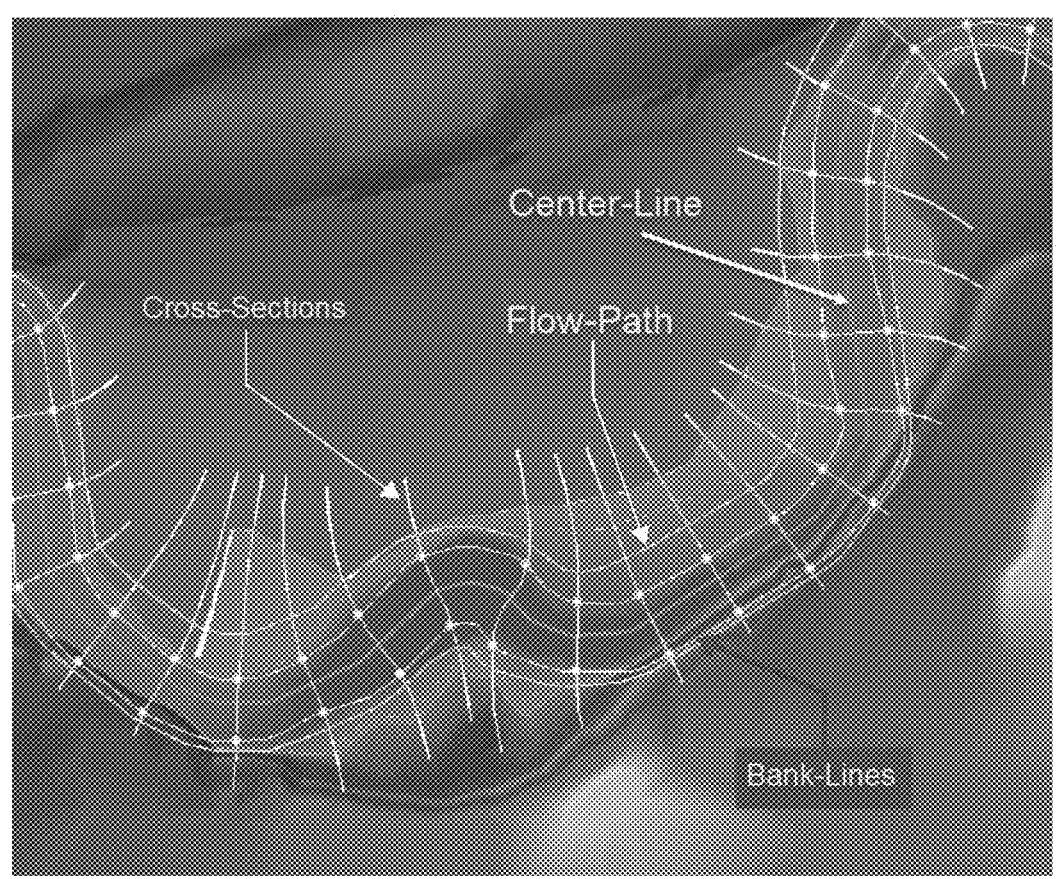
FIG. 7 is a diagram of a stream channel and floodplain with a series of cross-section lines, bank lines, and flow-path lines along a sinuous channel in a stream network according to a non-limiting embodiment.
Figure 8:
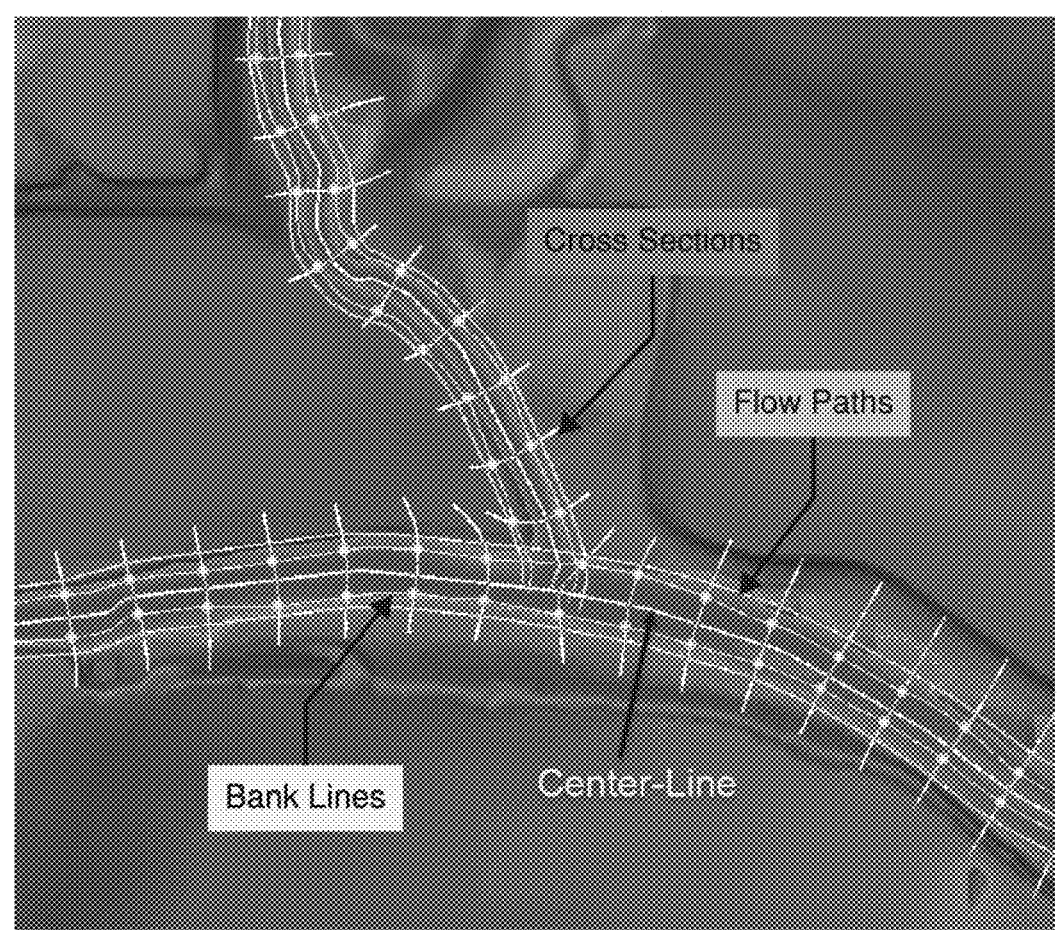
FIG. 8 is a diagram of a stream channel and floodplain with a series of cross-section lines, bank lines, and flow-path lines, showing exemplary non-intersecting sections for a junction with other reaches, according to a non-limiting embodiment.

In some non-limiting embodiments or aspects, hydraulics-tuning system 102 receives or obtains data from stream data source 104 for generating non-intersecting cross-sections, bank lines that follow the edge of the main channel, and flow-paths that are generated along the center of the area in cross-section for both over banks. Hydraulics-tuning system 102 is programmed or configured to generate flow-paths and bank lines without including or containing any local or global self-intersections. FIGS. 6, 7, and 8 as discussed below, show examples of hydraulic geometry that is automatically generated by River Systems.

In some non-limiting embodiments or aspects, hydraulics-tuning system 102 transmits stream data for generating bank lines that follow the edge of the main channel, and flow-paths are generated along the center of the area in cross-section for both over banks. Hydraulics-tuning system 102 is programmed or configured to generate flow-paths and bank lines without including or containing any local or global self-intersections.

As shown in FIG. 4, at step 404, process 400 may include generating discrete stream points corresponding to a point of a regular interval along a centerline of each stream in the stream network. For example, in non-limiting embodiments, hydraulics-tuning system 102 generates a plurality of discrete stream points corresponding to a point along a centerline of the stream, the discrete stream points in correspondence with a regular interval along a centerline of each stream in the stream network. In some examples, hydraulics-tuning system 102 generates a plurality of discrete stream points on a computing system with a plurality of processors for parallel processing the discrete stream points corresponding to a point along a centerline of the stream.

In non-limiting embodiments, the first step in the algorithm is to discretize the stream network to prepare it for the numerical solver. For example, hydraulics-tuning system 102 generates a plurality of points along the stream centerlines. In such an example, hydraulics-tuning system 102 generates a plurality of points along the stream centerlines with a spacing similar to the resolution of the DTM. In other examples, a more optimal spacing can be determined based on the stream network. Accordingly, hydraulics-tuning system 102 generates a plurality of points along the stream centerlines to generate a set of points in the plane along the stream centerlines or each reach in the network. Hydraulics-tuning system 102 generates a plurality of points along the stream centerlines, and orders points from upstream to downstream so that the right normal vector $n_i$ of any of the interior points $p_i$ of any reach can be calculated.

In non-limiting embodiments, once the stream network is discretized, points along the stream centerlines are chosen at a regular spacing and used as the starting points for the initial value problem (IVP). For example, when generating the plurality of discrete stream points in the stream network, hydraulics-tuning system 102 determines each stream point to correspond to a discrete portion of the stream at a point along the stream centerline.

In non-limiting embodiments, the discrete stream points comprise an order, such that hydraulics-tuning system 102 determines the order either moving in a direction from upstream to downstream or downstream to upstream. As an example, hydraulics-tuning system 102 generates discrete stream points and determines the order of the discrete stream points in a direction from upstream to downstream. Alternatively, hydraulics-tuning system 102 generates discrete stream points and determines the order of the discrete stream points in a direction from downstream to upstream.

As shown in FIG. 4, at step 406, process 400 may include automatically generating normal vectors of the stream network originating from a unique starting point selected from the plurality of discrete stream points. For example, in some non-limiting embodiments or aspects, hydraulics-tuning system 102 automatically generates a plurality of normal vectors of the stream network, each normal vector originating from a unique starting point selected from the plurality of discrete stream points. In some examples, hydraulics-tuning system 102 generates the plurality of normal vectors of the stream network on a computing system with a plurality of processors for parallel processing.

In non-limiting embodiments, for each reach in the network, hydraulics-tuning system 102 generates the points ordered from upstream to downstream so that the right normal vector $n_i$ of any of the interior points $p_i$ of any reach can be calculated as follows:

$$\Delta p = p_{i+1} - p_{i-1}, \ \theta_i = \operatorname{atan} 2(\Delta p_{i,1}, \Delta p_{i,0}); \text{ and}$$

$$n_i = \begin{bmatrix} \cos\left(\theta_i - \dfrac{\pi}{2}\right) \\ \sin\left(\theta_i - \dfrac{\pi}{2}\right) \end{bmatrix}$$

In some non-limiting embodiments or aspects, hydraulics-tuning system 102 determines a normal vector in any of the discrete points of any stream or reach. As an example, the angle is determined by hydraulics-tuning system 102 based on the angle formed in the change between a first point and a second point, wherein the discrete points change with respect to the angle of the stream.

As shown in FIG. 4, at step 408, process 400 may include generating non-intersecting cross-section(s) in the stream network comprising a curve based on the flow information and originating from the of normal vector(s) configured to avoid intersection with each point in its own cross-section and points in other non-intersecting cross-section(s). For example, in some non-limiting embodiments or aspects, hydraulics-tuning system 102 generates a plurality of non-intersecting cross-sections in the stream network, each non-intersecting cross-section comprising a curve generated based on one or more of the plurality of normal vectors and defined to avoid intersection with each point in its own cross-section while avoiding intersection with points in each of the other non-intersecting cross-sections in the stream network. In some examples, hydraulics-tuning system 102 generates the plurality of non-intersecting cross-sections in the stream network on a computing system with a plurality of processors for parallel processing the discrete stream points corresponding to a point along a centerline of the stream. In such an example, the improved hydraulics-tuning system 102 generates the plurality of non-intersecting cross-sections more efficiently by dividing the generating step onto a plurality of parallel processors, by completing the entire series of non-intersecting cross-sections (e.g., an entire batch of non-intersection cross-sections for a specified stream network, a portion of non-intersection cross-sections, and/or the like) before making further determinations about the flow-paths, bank lines, adjustments, and/or the like.

In some non-limiting embodiments or aspects, the curve comprises a non-planar and non-intersecting cross-section. As an example, hydraulics-tuning system 102 generates a full cross-section based on a number of points in a set. The full cross-section is then constructed or generated by hydraulics-tuning system 102 such that a single curve is obtained for $\gamma_j$ by ordering the points in the sets from left to the right relative to the downstream flow direction. In some non-limiting embodiments, the equations are parallelizable since each cross-section computation can share the same allocation of constant memory (network points and normal vectors), and the calculations are otherwise independent of each other. In such an example, hydraulics-tuning system 102 utilizes GPU hardware to improve efficiency and accuracy.

In some non-limiting embodiments or aspects, hydraulics-tuning system 102 determines the cross-section using an ODE (e.g., is an equation that involves some ordinary derivatives (as opposed to partial derivatives) by solving an integrator function. The process can be visualized in FIG. 6 which shows the vector field followed by the cross-sections generated with the ODE, as they are produced and visualized.

In non-limiting embodiments or aspects, hydraulics-tuning system 102 generates the curve representing each cross-section to pass through a unique point $p_j$ on the centerline of the stream network. Generating the cross-sections involves generating the curve for each non-intersecting cross-section by finding the solution, for each point $p_j$, to the equation:

$$\frac{dy_j}{dt} = y'_j = \frac{f}{\|f\|}, \text{ where } y_j(0) = p_j$$

In this ODE equation, $\gamma_j$ is the solution in the plane of the cross-section j passing through the point $p_j$ on a centerline of the stream network. Since $\gamma_j$ is undefined at t=0, two separate solutions are needed. One solution defines the left side of the cross-section, and the other solution defines the right side of the cross-section. For example, hydraulics-tuning system 102 extends the IVP with two initial values for $\gamma_j$ and solving for both cases, for the equation $$y'_j(0) = \left\{ \begin{array}{l} n_j \\ -n_j \end{array} \right.$$

In non-limiting embodiments, the vector field $f(\gamma)$ includes a sum over a plurality of points $p_i$ forming the centerline that are near to the curve based on a spatial indexing structure, such as a data structure for a multidimensional searching (e.g., KD Tree, etc.) and is computed by the equation:

$$f(y) = \sum_i \frac{n_i g_i}{d_i^2}.$$

For example, once the stream network is discretized, points along the stream centerlines are chosen at a regular spacing and used as the starting points for the IVP. The right-hand-side of the ODE is the unit vector in a direction of $$\sum_i \frac{n_i g_i}{d_i^2},$$

in a direction to the right or left of the stream centerline.

In non-limiting embodiments, hydraulics-tuning system 102 determines $n_i$, $g_i$, and $d_i$ from:

$$n_i = \begin{bmatrix} \cos\left(\theta_i - \frac{\pi}{2}\right) \\ \sin\left(\theta_i - \frac{\pi}{2}\right) \end{bmatrix}, \text{ such that } \theta_i = \text{atan2}(\Delta p_{i,1}, \Delta p_{i,0}).$$

In such an example, hydraulics-tuning system 102 determines $\Delta p_i$ from the equation $\Delta p_i = p_{i+1} - p_{i-1}$.

In non-limiting embodiments, $g_i$ is a function that determines which normal vector will contribute to the solution (i.e. left or right) and $d_i$ is the Euclidean distance between $p_i$ and $\gamma$. For example, the equation for:

$$g_i = \begin{cases} 1 & (u_i \times v_i)_2 \geq 0 \\ -1 & \text{otherwise} \end{cases}, \text{ when } u_i = \begin{bmatrix} y_0 - p_{i,0} \\ y_1 - p_{i,0} \\ 0 \end{bmatrix},$$

$$v_i = \begin{bmatrix} -n_{i,1} \\ n_{i,0} \\ 0 \end{bmatrix}, \text{ and } d_i = \|y - p_i\|.$$

The solution curve remains unchanged if either the equation $$f(y) = \sum_i \frac{n_i g_i}{d_i^2}$$

or its unit vector is used as the right-hand-side of the ODE. However, in non-limiting embodiments, the unit vector of $$f(y) = \sum_i \frac{n_i g_i}{d_i^2}$$

is used rather than the equation itself to increase numerical stability and ensure that the integration step is one to one with distance in the plane which allows integration to easily stop once the desired cross-section width is obtained.

In non-limiting embodiments, the inverse distance squared term in $$f(y) = \sum_i \frac{n_i g_i}{d_i^2}$$

ensures that the cross-sections will pass through the stream centerlines perpendicular to flow in the channel defined by the local curvature of the streams, but also maintain a perpendicular orientation to the flow-path in the overbanks defined by the global curvature of the streams. Since many of the points in the network are likely to be too far away to meaningfully contribute to the solution, a spatial indexing structure such as a KD-Tree can be used to cull points that are far away.

In some non-limiting embodiments or aspects, generating the plurality of non-intersecting cross-sections includes generating a plurality of cross-sections perpendicular to the flow direction or as an adjustment or update to a hydraulic model, to intersect the centerline of the stream perpendicular to a flow in the local curvature of the stream. In non-limiting embodiments, hydraulics-tuning system 102 generates a plurality of non-intersecting cross-sections, each cross-section includes an orientation with respect to a flow-path in the overbanks defined by the global curvature of the streams. Generating a plurality of non-intersecting cross-sections includes cross-sections generated by hydraulics-tuning system 102 to extend to within a threshold width of a floodplain. In some examples, cross-sections generated by hydraulics-tuning system 102 to extend to within a threshold width of a floodplain are provided as an adjustment or update to a hydraulic model.

In some non-limiting embodiments or aspects, hydraulics-tuning system 102 generates or determines a curve for a non-intersecting cross-section by combining two solutions in an order of left to right in the direction of the stream, wherein one solution provides the left side of the cross-section, and a second solution provides the right side of the cross-section.

In some non-limiting embodiments or aspects, hydraulics-tuning system 102 generates bank lines as described with respect to FIG. 5 herein below, such that the overbank line (e.g., bank line) is defined to enable the generation of a smooth, variable offset curve with no self-intersections. In some non-limiting embodiments or aspects, flow-paths (i.e., flow-path lines) are provided as described and shown with reference to FIG. 6 herein below, such that the flow-paths are provided in the center or near (e.g., within a threshold distance) a center of the area of the cross-section profile positioned between the stream centerline and either of the left and right overbanks.

In some non-limiting embodiments or aspects, the hydraulic modeling requirement comprises the cross-section extent being within a predetermined threshold of the width of the floodplain at the intersection of the cross-section and the floodplain. For example, once the cross-sections have been generated to the required length, they can be clipped to floodplain extent (e.g., the width of the floodplain at the intersection of the cross-section and the floodplain). This can be accomplished with a user-specified polygon extent or by inferring the extent using the DTM and a user-specified maximum cross-section vertical height.

In non-limiting embodiments, the spatial indexing structure can use a KD-Tree, a KD-Tree matrix, or similar structure to cull points since many of the points in the stream network are likely to be too far away to meaningfully contribute to the solution, a spatial indexing structure such as the KD-Tree can be used to cull points (e.g., points in the vector field) that are far away, for example by finding points that are within a threshold of the point, or eliminating points that are outside a threshold. In some non-limiting embodiments, it is determined that culling is not necessary, and no points are culled to determine a cross-section or a point in the cross-section. In other non-limiting embodiments, one or more points are culled from the plurality of points $p_i$ forming the centerline are a threshold distance away from the curve.

As shown in FIG. 4, at step 410, process 400 may include automatically adjusting the plurality of cross-sections to satisfy a hydraulic modeling requirement. For example, in some non-limiting embodiments or aspects, hydraulics-tuning system 102 automatically adjusts the plurality of cross-sections to satisfy a hydraulic modeling requirement. Alternatively, for example, a user interface as shown in FIG. 13, may be used to input parameters for generating and adjusting the cross-section to approximate the length of a floodplain extent.

In some non-limiting embodiments or aspects, once cross-sections have been generated to the required length, they can be clipped to floodplain extent. This can be accomplished with a user-specified polygon extent in a user interface display or by automatically inferring the extent using the DTM and a user-specified maximum cross-section vertical height.

In non-limiting embodiments, a hydraulic modeling requirement is adjusted to extend a cross-section to satisfy a minimum elevation increase, or to reduce the spacing between cross-sections per reach. For example, the spacing between curves can be optimized by adjusting a distance between two or more curves based on specified conditions in at least one of the stream, the stream network, and a user preference. The cross-sections can be systematically refined to satisfy a predetermined combination of hydraulic modeling requirements, such as to meet a minimum elevation increase, to reduce the spacing between cross-sections, or to match a predetermined number of cross-sections per reach.

In some non-limiting embodiments or aspects, hydraulics-tuning system 102 clips the cross-section to approximate the length of a floodplain extent, such that the floodplain extent is based on a user-specified polygon, based on an approximate floodplain polygon that was automatically generated for the stream network, or determined by inferring the extent using digital terrain information and a user-specified maximum cross-section vertical height. For example, a user interface as shown in FIG. 13, provides a graphical user interface 1300 that may be used for inputting parameters for generating and adjusting the hydraulic bank constructor for clipping the cross-section to approximate the length of a floodplain extent.

Referring now to FIG. 5, shown is a process for generating a one-dimensional hydraulic model of a stream network according to a non-limiting embodiment. The steps shown in FIG. 5 are for example purposes only. It will be appreciated that additional, fewer, different, and/or a different order of steps may be used in non-limiting embodiments.

As shown in FIG. 5, at step 502, process 500 may include generating a bank line or a flow-path line by generating interpolation points based on a constant offset from the stream centerline along a cross-section or by inferring the inflection point from the vertical profiles of the cross-sections. For example, in some non-limiting embodiments or aspects, hydraulics-tuning system 102 generates a bank line or a flow-path line by generating a plurality of interpolation points based on a constant offset from the stream centerline along a cross-section or by inferring the inflection point from the vertical profiles of the cross-sections.

Figure 10:
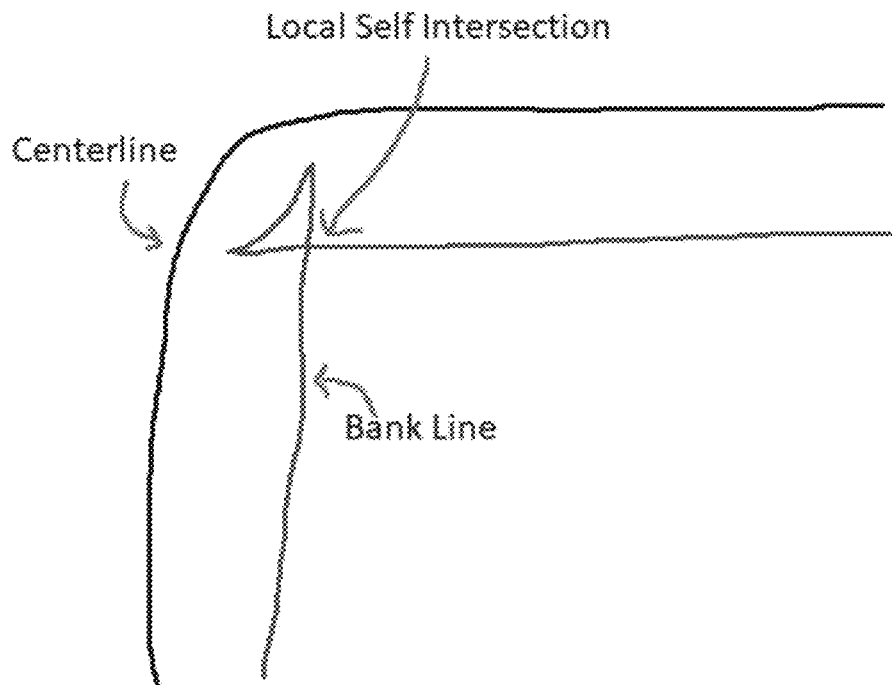
FIG. 10 is a diagram of an exemplary of a local self-intersection according to a non-limiting embodiment.
Figure 11:
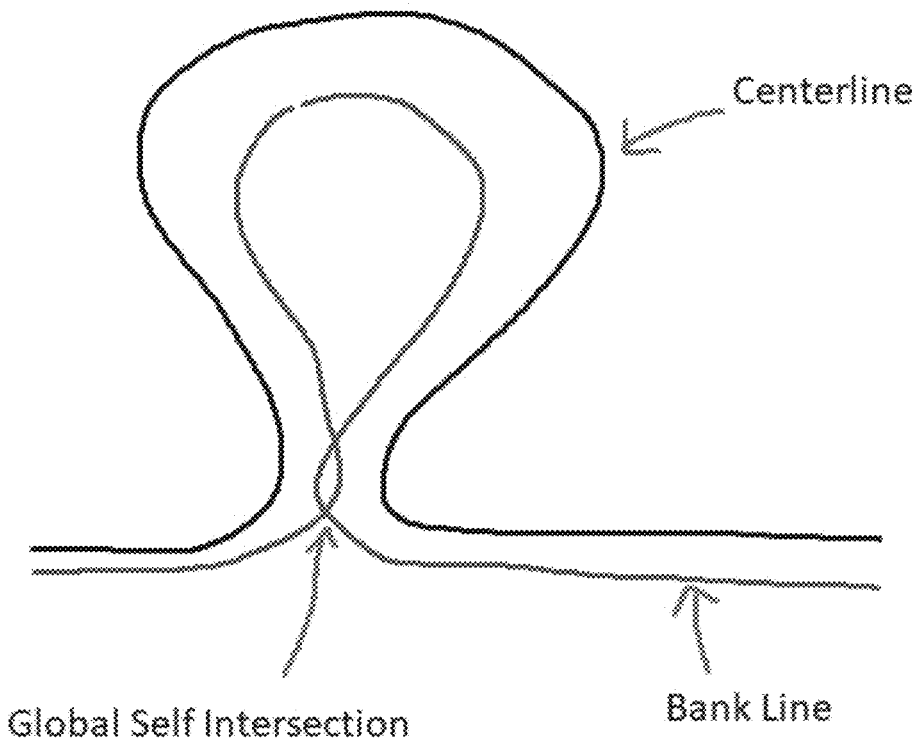
FIG. 11 is a diagram of an exemplary global self-intersection according to a non-limiting embodiment.

In non-limiting embodiments, hydraulics-tuning system 102 assigns bank line points on the cross-sections where the channel ends and the overbank starts. This is performed by hydraulics-tuning system 102 for both the left and the right over banks. The bank lines are determined so that they can be relatively smooth and eliminate or avoid any self-intersections (global or local). To eliminate self-intersection (e.g., an implementation of a curve offset algorithm that offsets each point on the curve by a specified distance along the normal vector which produces a local self-intersection, etc.), hydraulics-tuning system 102 generates bank lines that adjusts the local curvature so that it is not greater than the offset distance, and causing a self-intersection, as shown in FIG. 10. A global self-intersection is also avoided. A global self-intersection occurs when two points that are distant from each other, as measured along the stream centerline, come close together in the plane as shown in FIG. 11.

Hydraulics-tuning system 102 is configured to eliminate local self-intersections. In non-limiting embodiments, hydraulics-tuning system 102 detects and fixes global self-intersections by using an ODE to solve a problem of generating smooth non-self-intersecting offset curves.

In some non-limiting embodiments or aspects, hydraulics-tuning system 102 generates a smooth, variable offset curve with no self-intersections based on a solution to a first-order ODE that interpolates a set of points on a curve's left or right side. The set of points to interpolate are generated using a constant offset from the stream centerline along the generated cross-sections or by inferring the inflection point from the vertical profiles of the cross-sections.

In non-limiting embodiments, as the interpolation points are generated, the algorithm splits the points into two sets for each reach. The two sets of points lie on the left and right sides of the reaches relative to the downstream direction. A simple check for whether a point is on the left side or the right side of the reach is done using the equation for $$g_i = \begin{cases} 1 & (u_i \times v_i)_2 \geq 0 \\ -1 & \text{otherwise} \end{cases}, \text{ when } u_i = \begin{bmatrix} y_0 - p_{i,0} \\ y_1 - p_{i,0} \\ 0 \end{bmatrix},$$

$$v_i = \begin{bmatrix} -n_{i,1} \\ n_{i,0} \\ 0 \end{bmatrix},$$

where p and n are the nearest point and normal on the reach to the test point y and g=1 indicating the point is on the right side of the reach and g=−1 indicating the point is on the left side of the reach.

As the points are split into left and right sets, the points are ordered downstream by querying the nearest point on the reach for each point and sorting by the index of the nearest point. So all j interpolation points $q_j$ are sorted in increasing order according to:

$$I(q_j) = i; \text{ s.t. } \sigma(q_i) = d_i(q_j),$$

where $\delta(x)$ is defined by the equation $\delta(x) = \min(x - p_i)$.

In some non-limiting embodiments or aspects, the ODE above is constructed such that it tends to move through points in a direction of downstream when it is near the correct offset distance and tends to move either closer or further away from the stream to match the correct offset distance. In such an example, hydraulics-tuning system 102 defines a vector perpendicular to flow at y as $\eta$ and a vector in the direction of flow as v as shown in:

$$n = \frac{f}{\|f\|}, v_i = \begin{bmatrix} -n_1 \\ n_0 \end{bmatrix}, \text{ where } f(y) = \sum_i \frac{n_i g_i}{d_i^2},$$

such that the IVP becomes:

$$y' = \beta v - \alpha n, \text{ and } y(0) = q_0.$$

The functions for a and $\beta$ can be defined in terms of a target offset distance m and an interpolation tolerance h. As an example, when h=1 it has been determined that the curve will pass very close to the given interpolation points. In addition, if smoother curves are desired (required), h can be increased so that the curve will approximately interpolate the offset points. In such an example, the functions for $\alpha$ and $\beta$ are defined in terms of the target offset distance $\Phi$ and the interpolation tolerance h, such that:

$$\Phi(y) = \frac{\sum_j \frac{\delta(q_i)}{\|y - q_i\|}}{\sum_j \frac{1}{\|y - 1_j\|}}, \text{ where } s = \delta(y) - \phi(y), h = 1, \text{ and}$$

$$\alpha = \frac{2}{1 + e^{-s/h}} - 1, \beta = e^{-\left(\frac{s}{h}\right)^2}.$$

Notice when s=0 the target offset distance is the same as the current offset distance so $\alpha$=0 and $\beta$=1 meaning that the curve moves downstream in the direction of v only.

Integration continues until the index of the nearest point on the reach toy, is greater than or equal to the index of the nearest point on the reach to qn−1, where qn−1 is the last interpolation point on the reach. In other words $$I(y) \geq I(q_{n-1}).$$

FIG. 8 described herein below, shows an example of a vector field followed by the bank lines and flow-paths, according to non-limiting embodiments. Returning to FIG. 5, in non-limiting embodiments, hydraulics-tuning system 102 generates the bank lines and/or flow-path lines for the left and right sides of each reach to produce the bank lines or flow-path lines for the stream network. In addition, bank stations are assigned to cross-sections at a point where they intersect with the bank lines. If the cross-section does not intersect with the bank line, it may be determined that the reach is too sinuous. In such an example, the bank station will be set at the end of the cross-section.

As shown in FIG. 5, at step 504, process 500 may include may include ordering interpolation points in a downstream direction by locating a closest reach point for each point and sorting based on the index of the nearest point, wherein each interpolation point is sorted by increasing or decreasing order. For example, in some non-limiting embodiments or aspects, hydraulics-tuning system 102 orders the plurality of interpolation points in a downstream direction by locating a closest reach point for each point and sorting based on the index of the nearest point, wherein each interpolation point is sorted by increasing or decreasing order.

In some non-limiting embodiments or aspects, the over-bank line comprises one or more interpolation points on the cross-section between the bank section and the end of the cross-section, and wherein the interpolation points are derived from a user-specified parameter, within a range starting along a bank line and ending at the cross-section.

As shown in FIG. 5, at step 506, process 500 may include interpolating, using a stream-bank constructor, a set of points on a curve corresponding to a bank on a side of the stream, and the stream-bank constructor. For example, in some non-limiting embodiments or aspects, hydraulics-tuning system 102 uses a stream-bank constructor and a set of points on a curve corresponding to a bank on a side of the stream. For example, a user interface as shown in FIGS. 13, 15, and 16, may be used to input parameters for generating and adjusting the hydraulic bank constructor.

In non-limiting embodiments, hydraulics-tuning system 102 generates bank lines by assigning bank interpolation points on the cross-sections where the channel ends and the overbank starts for both the left and the right over banks, and then generating flow-path lines includes generating flow-path interpolation points on the cross-section between the bank station and the end of the cross-section derived from a predetermined threshold between 0.0 and 1.0. For example, 0.0 identifies the location along the bank line and 1.0 is the location along the ends of the cross-section. In non-limiting embodiments, flow-path lines are determined in the same way as the bank lines, but the interpolation points used are points on the cross-section between the bank station and the end of the cross-section derived from a user-specified parameter between 0.0 and 1.0, with 0.0 being along the bank line and 1.0 being along the ends of the cross-section.

In some non-limiting embodiments or aspects, the constructor:

$$y' = \beta v - \alpha \eta, \ y(0) = q_0$$

is configured to determine a variable offset from the stream centerline. For example, a stream centerline along the generated cross-sections, where interpolating comprises a constructor that is configured to select points along the bank in a downstream direction as it nears the correct offset distance, and moves either closer to the stream to match the correct offset distance, or moves further away from the stream to match the correct offset distance.

As shown in FIG. 5, at step 508, process 500 may include automatically interpolating until the index of the closest point on the reach to the starting point, that is also greater than or equal to the index of the closest point on the reach to the last interpolation point on the reach. For example, a user interface that as shown in FIGS. 13, and 15-16, may be used to input parameters for generating and adjusting the hydraulic data and the hydraulics model.

For example, in some non-limiting embodiments or aspects, hydraulics-tuning system 102 automatically interpolates until the index of the closest point on the reach to the starting point that is also greater than or equal to the index of the closest point on the reach to the last interpolation point on the reach. In non-limiting embodiments, hydraulics-tuning system 102 splits the interpolation points into two sets of points after the points are generated, a set of points for each of the left and right reach. Once the necessary geometry files have been constructed, including HEC-RAS model files for the model plan, geometry of the stream and flow can be generated and visualized in an improved manner, along with the extent of the floodplain and any other points in the geographic area of the stream which may be affected.

FIG. 6 is a diagram of non-limiting embodiments or aspects of a hydraulic model representing a stream channel and a floodplain as a series of cross-section lines, bank lines, and flow-path lines, and a center-line along the channel. The cross-section lines, bank lines, and flow-path lines are automatically generated, and as shown, overlaid on a Digital Terrain Model. In addition, the cross-sections are automatically generated to extend and cover the floodplain extent as shown.

FIG. 7 is a diagram of non-limiting embodiments or aspects of a hydraulic model representing a stream channel and floodplain as a series of cross-section lines, bank lines, and flow-path lines along the channel. The cross-section lines, bank lines, and flow-path lines are automatically generated, and as shown, overlaid on a Digital Terrain Model. More specifically, the cross-section lines are generated to maintain a perpendicular intersection as shown in FIG. 7, with the stream center lines, the bank lines, and the flow-paths. In addition, the cross-sections are configured to avoid and not contain self-intersections even in sinuous areas, as shown here with the cross-sections generated in the area of the stream with turns and curves.

In some non-limiting embodiments or aspects, hydraulics-tuning system 102 places or generates the cross sections uniformly spaced as measured along the stream centerline according to a user specified spacing. In non-limiting embodiments, the normal vectors are only placed on the stream centerline and are, thus, only a subset of the vector field (e.g., an entire or whole vector field), and a curve of the cross-section may follow or be influenced in a direction, according to the specified equations.

FIG. 8 is a diagram of non-limiting embodiments or aspects of a hydraulic model representing a stream channel and floodplain as a series of cross-section lines, bank lines, and flow-path lines along the channel. The cross-section lines, bank lines, and flow-path lines are automatically generated, and as shown, overlaid on a Digital Terrain Model. FIG. 8 shows an exemplary junction with other reaches forming a stream network extending from the junction and having sinuous reaches where they bend. However, the cross-sections are generated as non-intersecting, even at areas that bend from junctions with other reaches.

Figure 9:
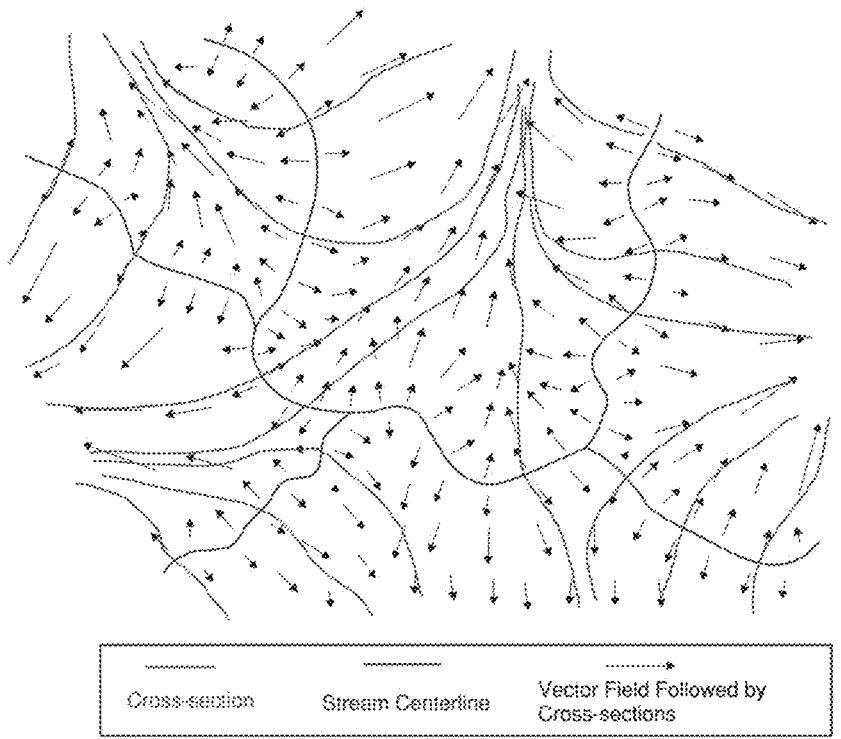
FIG. 9 is a diagram of an exemplary vector field followed by non-intersecting cross-sections according to a non-limiting embodiment.

FIG. 9 is a diagram of non-limiting embodiments or aspects of an exemplary vector field followed by the cross-sections generated to account for the flow information. The full cross-section is constructed such that a single curve is obtained for $\gamma_j$ by ordering the points in the sets for each cross-section from left to the right and relative to the downstream flow direction as determined from the components of the exemplary vector field. As explained above, the vector field is based on the discretized stream network, and hydraulics-tuning system 102 determines points along the stream centerlines, such as by selecting points at a regular spacing that are used as the starting points for the IVP in order to generate non-intersecting cross-sections.

In some non-limiting embodiments or aspects, hydraulics-tuning system 102 places or generates the cross sections uniformly spaced as measured along the stream centerline according to a user specified spacing. In non-limiting embodiments, the normal vectors are only placed on the stream centerline and are, thus, only a subset of the vector field (e.g., an entire or whole vector field), and a curve of the cross-section may follow, or be influenced in a direction, according to the specified equations.

FIG. 10 shows a diagram of an exemplary local self-intersection according to non-limiting embodiments. The local self-intersection is formed from an offset curve followed by bank lines and flow-paths as they are generated and/or displayed.

FIG. 11 shows a diagram of an exemplary global self-intersection according to non-limiting embodiments. As shown, the global self-intersection according to FIG. 11, is determined from an offset curve along the bank lines and flow-paths as they are generated and/or displayed.

Figure 12:
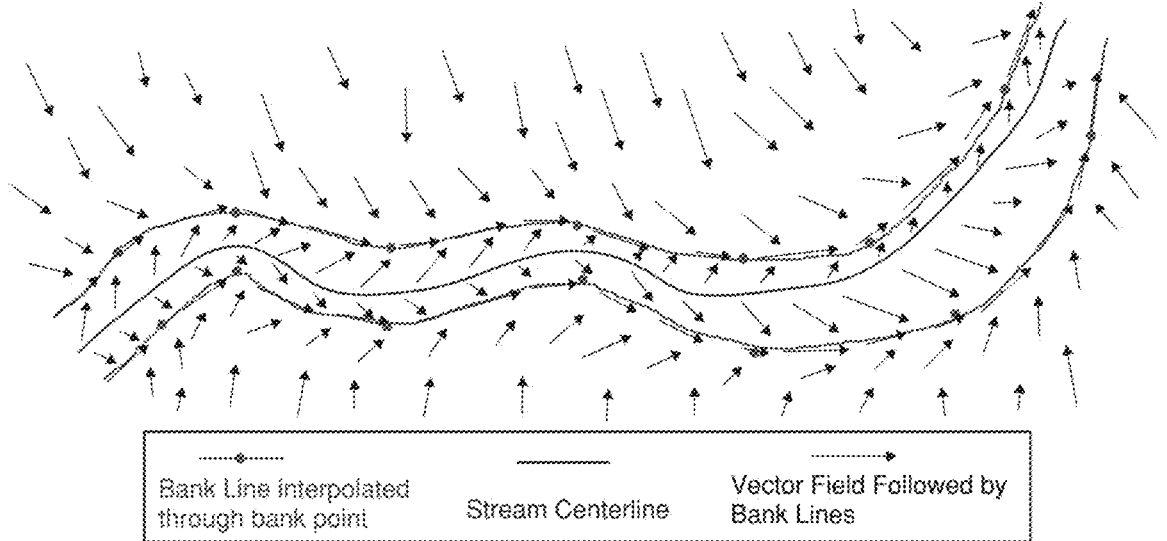
FIG. 12 is a diagram of a vector field followed by the bank lines and flow-paths according to a non-limiting embodiment.

FIG. 12 shows a diagram of an exemplary vector field followed by the bank lines and flow-paths according to non-limiting embodiments. The bank lines and flow-path lines as they are generated, formed, and/or displayed are relative to the downstream flow direction as determined from the components of the exemplary vector field. In non-limiting embodiments, the normal vectors are only placed on the stream centerline, the bank lines, and the flow-path lines, and are, thus, only a subset of the vector field (e.g., an entire or whole vector field), and a curve of the cross-section may follow, or be influenced in a direction, according to the specified equations.

FIG. 13 shows an exemplary user interface and input parameters for generating hydraulic data. For example, FIG. 13 shows a graphical user interface for adjusting the stream network, including study name 1302, reset parameters 1304, 100 year row rate 1306, smoothing radius 1308, smoothing angle 1310, vertex count 1312, cross section spacing 1314, bank method 1316, min channel width 1318, max channel width 1320, constant channel width 1322, overbank method 1324 (e.g., extend target height), min overbank width 1326, max overbank width 1328, target overbank height 1330, constant overbank width 1332, overbank flow path % 1334, friction method 1336, Manning's n left overbank 1338, Manning's n center 1340, Manning's n right overbank 1342, land cover Manning's n values 1344. FIGS. 15A-16C comprise exemplary figures showing the adjustment of a stream lines, bank lines, and flow-path lines.

Figure 14:
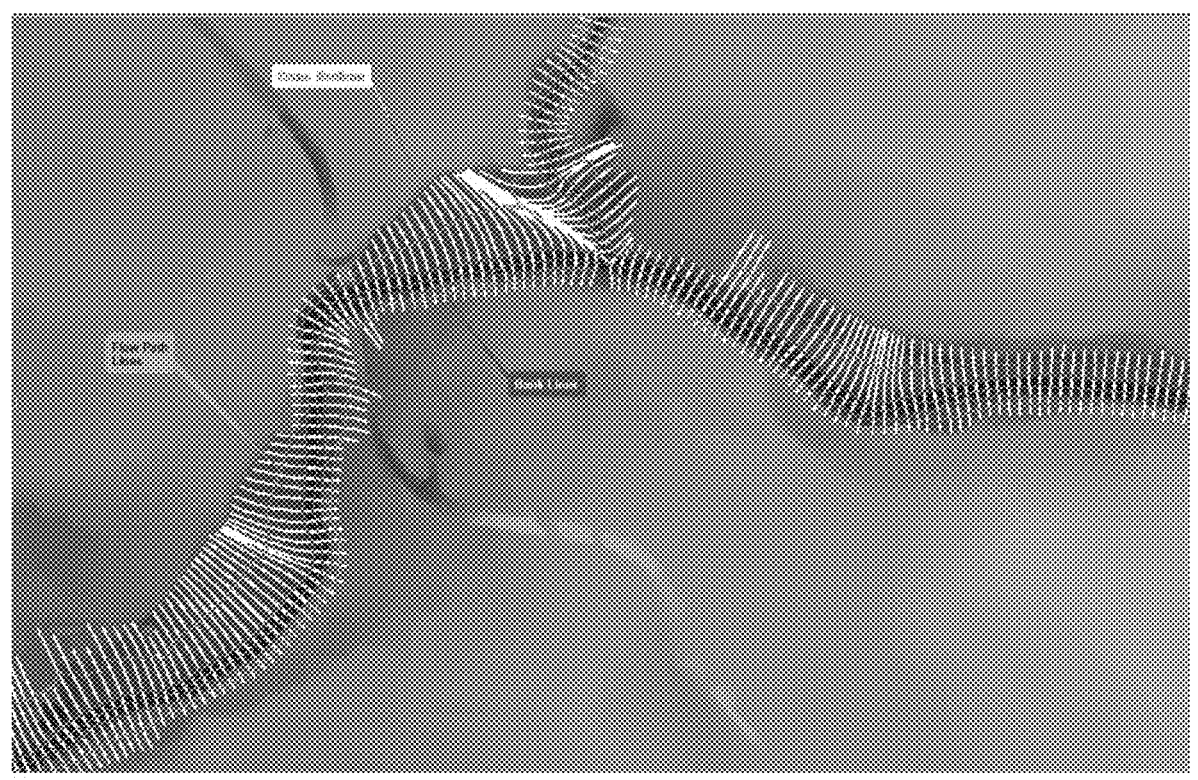
FIG. 14 shows a stream having auto-generated and adjusted stream centerlines, drainage points, and watershed boundaries created from terrain data according to some non-limiting embodiments or aspects.

FIG. 14 shows a stream having auto-generated and adjusted stream centerlines, drainage points, and watershed boundaries created from terrain data.

FIGS. 15A-C show cross-sections and information generated with the hydraulics tool to eliminate the repetitive work of generating, determining, and placement of cross sections, banks, and flow-paths, while providing capability to support engineering requirements and customizations per a study, stream, or reach, as shown having a width of cross section 1502, minimum elevation increase 1506, and estimated water surface elevation 1504, that in some non-limiting embodiments or aspects can be used to determine an adjustment of cross-sections as shown in FIG. 15C. Cross sections are angled perpendicular to the direction of flow. For example, cross-sections can be systematically refined (e.g., adjusted or tuned) to meet multiple hydraulic modeling requirements, such as by extending the cross-section 1502 to meet a minimum elevation increase, with reduced spacing to ensure two cross sections per reach, or prioritized for a specific stream at a confluence. In some non-limiting embodiments, the side 1508 of cross-section 1502 does not need to be extended, or alternatively may need to be adjusted to the stream. In some non-limiting embodiments or aspects, if estimated water surface elevation 1504 does not intersect with the ground elevation before the end of the cross-section 1502, side 1510 of cross-section 1502 can be extended by adjusting to the elevation. FIG. 15B shows a portion of a user interface (e.g., a portion of an interface of FIG. 13) for determining or configuring cross-section 1502. For example, cross-section 1502 can be based on a recommendation 1512, or may be configured based on the minimum elevation increase 1506 and estimated water surface elevation 1504 as explained above. FIG. 15B further illustrates user interface elements including: stream name field 1520; reach name field 1522; reset parameter control 1524; flow parameter field 1526; cross-section interval field 1528; minimum elevation increase parameter field 1530; and extend-to-minimum-elevation control 1514. These elements correspond to configurable parameters associated with cross-section generation and refinement described herein.

In some non-limiting embodiments or aspects, cross-sections can be systematically refined to meet multiple hydraulic modeling requirements. In some examples, a user maintains control over each of these refinements, how, when and where to apply. For example, cross sections can be widened to meet a specific minimum elevation increase, ensuring that the cross section covers the areas at risk of flooding. The refinement can be applied to the entire study or selected streams or reaches.

In some non-limiting embodiments or aspects, cross section placement can also be customized to meet several other modeling requirements, including: avoiding stream intersections and drainage structures such as bridges and culverts, prioritizing cross section placement by stream, so that the larger stream gets more cross sections than the smaller stream near their confluence, clipping cross sections to the extent of the terrain, ensuring at least two cross sections per stream, and/or the like.

Figures 16A, 16B, 16C:
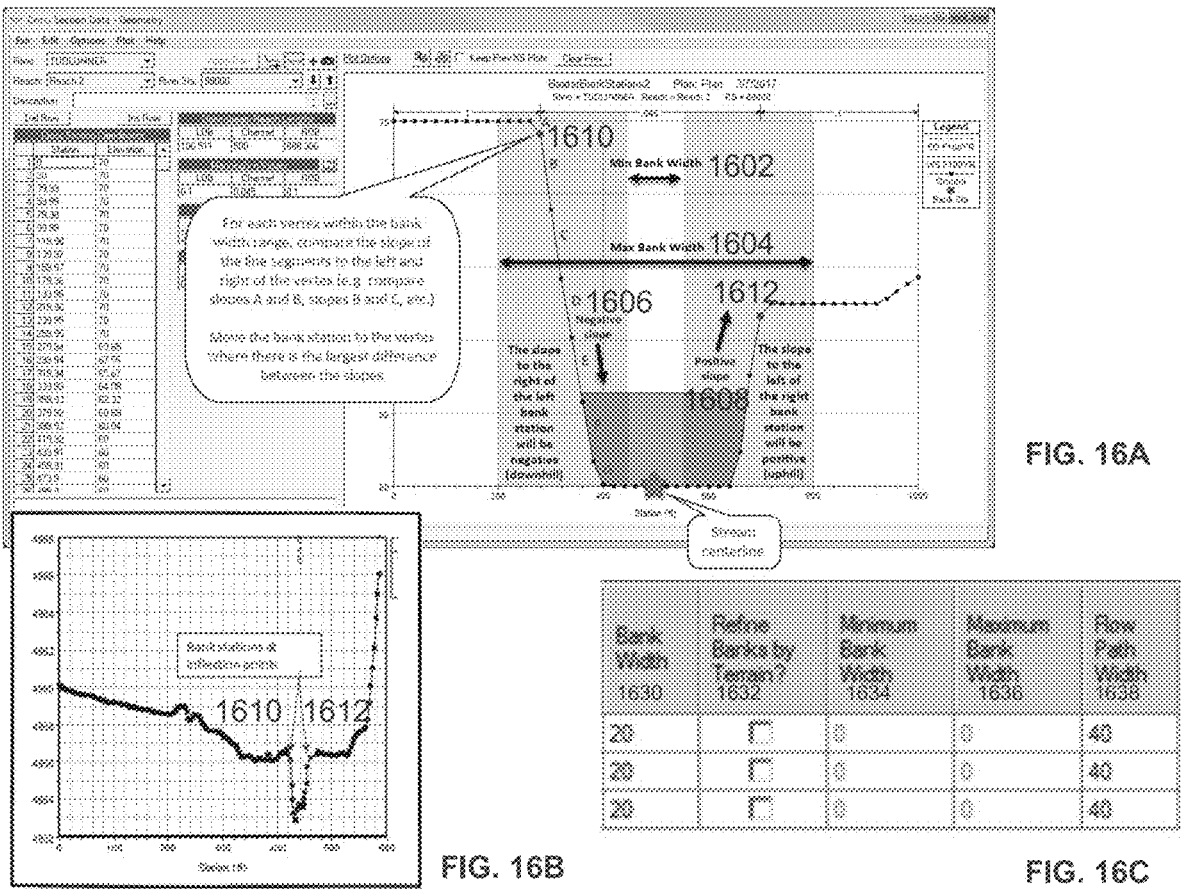
FIGS. 16A-C are diagrams of automatically reshaped bank lines according to some non-limiting embodiments or aspects.

With reference to FIGS. 16A-16C, an automatic reshaping of banks is shown, based on cross section elevation inflection points to better model the terrain. In the example, bank stations are moved to elevation inflection points, so that the bank lines better model the terrain. The system is capable of checking the terrain, and if checked, the system reviews the terrain around each bank point within a specified distance (50% of the bank width by default) to determine the elevation inflection point (where the angle is the greatest between three elevation points). If an inflection point is found, the bank station is moved there. In some examples, when the bank station points are connected, the resulting bank width line is based on terrain inflection points instead of a uniform buffer distance around the stream centerline.

Figure 17:
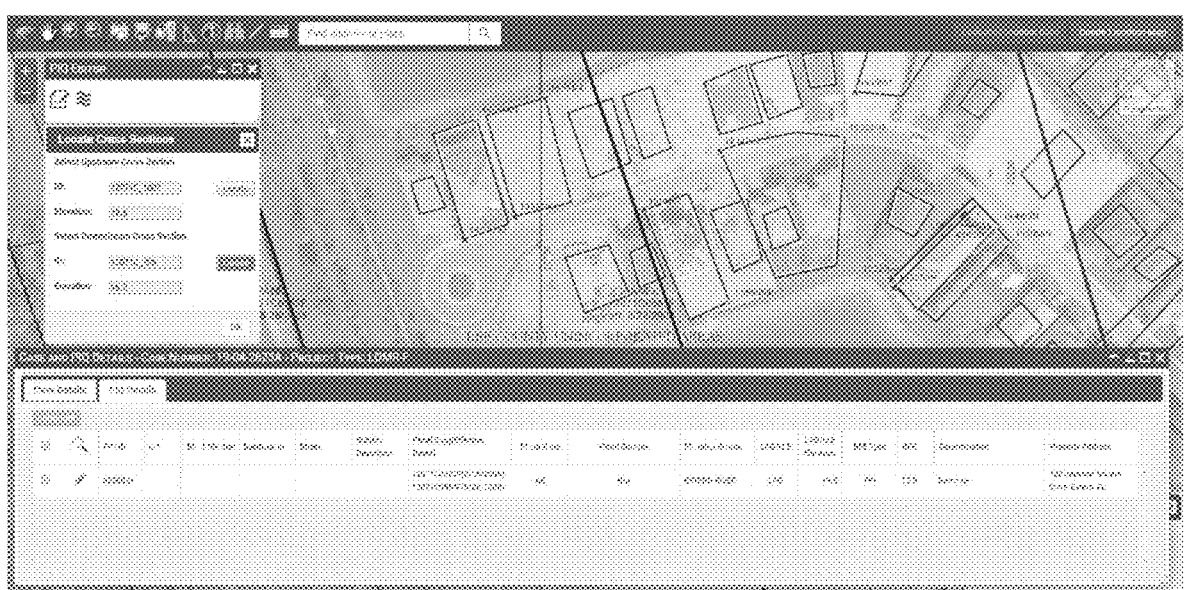
FIG. 17 is a diagram showing cross sections with base flood elevations according to some non-limiting embodiments or aspects.

As shown, for each vertex within the bank width range, the system compares the slope of the line segments to the left and right of the vertex (e.g., compare slopes A and B, slopes B and C, etc.), and in non-limiting embodiments, generates a bank station by moving the bank station to a vertex where there is the largest difference between the slopes. For example, the slope will be negative (e.g., downhill) when the slope to the right of the left bank station is negative. In other examples, the slope will be positive when the slope to the left of the right bank station is positive. In non-limiting embodiments, HEC-RAS model input files are automatically generated from the hydraulic data, and can be used to run steady flow analysis in HEC-RAS FIG. 17 shows cross sections with base flood elevations calculated in HEC-RAS and floodplain boundaries generated in River Systems that can be used to support MT-1 application review in LOMA Logic, for example, by determining if a property is in or out of a flood zone. In some non-limiting embodiments, this is especially useful where the NFHL is unavailable or outdated. The cross sections and base flood elevation data generated by the system can be used to determine an area (or areas) where there is an outdated flood zone data, no flood zone data at all, and/or the like.

Although embodiments have been described in detail for the purpose of illustration, it is to be understood that such detail is solely for that purpose and that the disclosure is not limited to the disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

The invention claimed is:

1. A computer-implemented method for generating a one-dimensional hydraulic model of a stream network, comprising:

obtaining, on a computing system with a plurality of processors, data including a stream network elevation for one or more streams, a plurality of centerlines, and flow information for the one or more streams in the stream network;

generating, on the computing system, a plurality of discrete stream points, wherein each point corresponds to a point of a regular interval along a centerline of each stream in the stream network;

automatically generating, on the computing system, a plurality of normal vectors of the stream network, each normal vector originating from a unique starting point selected from the plurality of discrete stream points;

generating, on the computing system, a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of an other non-intersecting cross-sections; and automatically adjusting, on the computing system, the plurality of cross-sections to satisfy a hydraulic modeling requirement plurality of non-intersecting cross-sections, wherein the curve corresponding to each cross-section passes through a unique point $p_j$ on the centerline of the stream network, and generating the cross-sections further comprises:

generating the curve for each non-intersecting cross-section by finding a solution, for each point $p_j$, to equation:

$$\frac{dy_j}{dt} = y'_j = \frac{f}{\|f\|}, \text{ where } y_j(0) = p_j;$$

wherein the vector field f(y) includes a sum over a plurality of points $p_i$ forming the centerline that are near to the curve based on a spatial indexing structure, and is computed by the equation:

$$f(y) = \sum_i \frac{n_i g_i}{d_i^2},$$

and determining $n_i$, $g_i$, and $d_i$ from:

$$n_i = \begin{bmatrix} \cos\left(\theta_i - \frac{\pi}{2}\right) \\ \sin\left(\theta_i - \frac{\pi}{2}\right) \end{bmatrix},$$

such that $\theta_i = \text{atan } 2 (\Delta p_{i,1}, \Delta p_{i,0})$ and $\Delta p_i = p_{i+1} - p_{i-1}$, and wherein $$g_i = \begin{cases} 1 & (u_i \times v_i)_2 \geq 0 \\ -1 & \text{otherwise} \end{cases}, \text{ when } u_i = \begin{bmatrix} y_0 - p_{i,0} \\ y_1 - p_{i,0} \\ 0 \end{bmatrix},$$

$$v_i = \begin{bmatrix} -n_{i,1} \\ n_{i,0} \\ 0 \end{bmatrix}, \text{ and } d_i = \|y - p_i\|;$$

and determining the normal vector in any of the discrete points of any stream or reach in the stream network, based on the angle formed in the change between a first point and a second point, wherein the discrete points change with respect to an angle of the stream.

2. The computer-implemented method of claim 1, wherein the curve is generated by combining two solutions in an order of left to right in a direction of the stream, wherein one solution provides a left side of the non-intersecting cross-section, and a second solution provides a right side of the non-intersecting cross-section, and the curve comprises a non-planar cross-section.

3. The computer-implemented method of claim 2, wherein a hydraulic modeling requirement is adjusted to extend a cross-section to satisfy a minimum elevation increase, to reduce spacing between cross-sections per reach, or to configure a cross-section extent within a predetermined threshold of the width of a floodplain at an intersection of the cross-section and the floodplain.

4. The computer-implemented method of claim 1, wherein generating the plurality of non-intersecting cross-sections, comprises any combination of:

generating at least one of the plurality of non-intersecting cross-sections perpendicular to the flow direction, to intersect the centerline of the stream perpendicular to a flow in a local curvature of the stream;

generating at least one of the plurality of non-intersecting cross-sections to include an orientation with respect to a flow-path in overbanks defined by a global curvature of the streams;

generating at least one of the plurality of non-intersecting cross-sections to extend to within a threshold width of a floodplain; or hydraulic modeling of the cross-section extent for at least one of the plurality of non-intersecting cross-sections within a predetermined threshold of the width of the floodplain at the intersection of the cross-section and the floodplain.

5. The computer-implemented method of claim 1, comprising:

in response to determining a cross-section has been generated to satisfy a threshold length, clipping the cross-section to approximate a length of a floodplain extent, wherein the floodplain extent is based on a user-specified polygon, based on an approximate floodplain polygon that was automatically generated for the stream network, or determined by inferring the floodplain extent using digital terrain information and a user-specified maximum cross-section vertical height.

6. The computer-implemented method of claim 1, further comprising:

generating a bank line or a flow-path line by generating a plurality of interpolation points based on a constant offset from the stream centerline along a cross-section or by inferring an inflection point from one or more vertical profiles of the cross-sections;

ordering the plurality of interpolation points in a downstream direction by locating a closest reach point for each point and sorting based on an index of a nearest point, wherein each interpolation point is sorted by increasing or decreasing order;

interpolating, using a stream-bank constructor, a set of points on a curve corresponding to a bank on a side of the stream; and automatically interpolating until the index of the closest point on the reach to the starting point is also greater than or equal to the index of the closest point on the reach to the last interpolation point on the reach.

7. The computer-implemented method of claim 6, wherein generating bank lines includes assigning bank interpolation points on the cross-sections where a channel ends and an overbank starts for both a left and a right over bank, and wherein generating flow-path lines includes generating flow-path interpolation points on the cross-section between a bank station and an end of the cross-section derived from a predetermined threshold between 0.0 and 1.0, wherein 0.0 identifies a location along the bank line and 1.0 is the location along the ends of the cross-section.

8. The computer-implemented method of claim 7, wherein the constructor, $y'=\beta\upsilon-\alpha\eta$, $y(0)=q_0$, is configured to determine a variable offset from the stream centerline along the generated cross-sections, wherein interpolating comprises the constructor that is configured to select points along the bank in a downstream direction as it nears the correct offset distance, moves either closer to the stream to match a correct offset distance, or further away from the stream to match the correct offset distance, wherein functions for $\alpha$ and $\beta$ are defined in terms of a target offset distance $\Phi$ and an interpolation tolerance h, such that $$\Phi(y) = \frac{\sum_j \frac{\delta(q_i)}{\|y-q_i\|}}{\sum_j \frac{1}{\|y-1_j\|}}, \text{ where } s = \delta(y) - \phi(y),\ h = 1, \text{ and}$$

$$\alpha = \frac{2}{1+e^{-s/h}} - 1,\ \beta = e^{-\left(\frac{s}{h}\right)^2}.$$

9. A system for tuning a one-dimensional hydraulic model of a stream network, comprising:

one or more processors programmed and/or configured to:

obtain data including a stream network elevation for one or more streams, a plurality of centerlines, and flow information for the one or more streams in the stream network;

generate a plurality of discrete stream points, wherein each point corresponds to a point of a regular interval along a centerline of each stream in the stream network;

automatically generate a plurality of normal vectors of the stream network, each normal vector originating from a unique starting point selected from the plurality of discrete stream points;

generate a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of an other non-intersecting cross-sections; and automatically adjust the plurality of non-intersecting cross-sections to satisfy a hydraulic modeling requirement, wherein the curve corresponding to each cross-section passes through a unique point $p_j$ on the centerline of the stream network, and the one or more processors configured to:

generate the curve for each non-intersecting cross-section by finding a solution, for each point $p_j$, to equation:

$$\frac{dy_j}{dt} = y'_j = \frac{f}{\|f\|}, \text{ where } y_j(0) = p_j;$$

wherein the vector field f(y) includes a sum over a plurality of points $p_i$ forming the centerline that are near to the curve based on a spatial indexing structure, and is computed by the equation:

$$f(y) = \sum_i \frac{n_i g_i}{d_i^2},$$

determining $n_i$, $g_i$, and $d_i$ from:

$$n_i = \begin{bmatrix} \cos\left(\theta_i - \frac{\pi}{2}\right) \\ \sin\left(\theta_i - \frac{\pi}{2}\right) \end{bmatrix},$$

such that $\theta_i=\text{atan }2\ (\Delta p_{i,1}, \Delta p_{i,0})$ and $\Delta p_i=p_{i+1}-p_{i-1}$, and wherein $$g_i = \begin{cases} 1 & (u_i \times v_i)_2 \geq 0 \\ -1 & \text{otherwise} \end{cases}, \text{ when } u_i = \begin{bmatrix} y_0 - p_{i,0} \\ y_1 - p_{i,0} \\ 0 \end{bmatrix},$$

$$v_i = \begin{bmatrix} -n_{i,1} \\ n_{i,0} \\ 0 \end{bmatrix}, \text{ and } d_i = \|y - p_i\|;$$

and determine the normal vector in any of the discrete points of any stream or reach of the stream network, based on an angle formed in the change between a first point and a second point, wherein the discrete points change with respect to the angle of the stream.

10. The system of claim 9, wherein the curve is generated by combining two solutions in an order of left to right in a direction of the stream, wherein one solution provides a left side of the non-intersecting cross-section, and a second solution provides a right side of the non-intersecting cross-section, and the curve comprises a non-planar cross-section.

11. The system of claim 10, wherein a hydraulic modeling requirement is adjusted to extend a cross-section to satisfy a minimum elevation increase, to reduce spacing between cross-sections per reach, or to configure a cross-section extent within a predetermined threshold of the width of a floodplain at an intersection of the cross-section and the floodplain.

12. The system of claim 9, comprising any combination of:

generating at least one of the plurality of non-intersecting cross-sections perpendicular to the flow direction, to intersect the centerline of the stream perpendicular to a flow in a local curvature of the stream;

generating at least one of the plurality of non-intersecting cross-sections to include an orientation with respect to a flow-path in overbanks defined by a global curvature of the streams;

generating at least one of the plurality of non-intersecting cross-sections to extend to within a threshold width of a floodplain; or hydraulic modeling of the cross-section extent for at least one of the plurality of non-intersecting cross-sections within a predetermined threshold of the width of the floodplain at the intersection of the cross-section and the floodplain.

13. The system of claim 9, wherein one or more processors are programmed and/or configured to:

in response to determining a cross-section has been generated to satisfy a threshold length, clipping the cross-section to approximate a length of a floodplain extent, wherein the floodplain extent is based on a user-specified polygon, based on an approximate floodplain polygon that was automatically generated for the stream network, or determined by inferring the floodplain extent using digital terrain information and a user-specified maximum cross-section vertical height.

14. The system of claim 9, wherein one or more processors are configured to:

generate a bank line or a flow-path line by generating a plurality of interpolation points based on a constant offset from the stream centerline along a cross-section or by inferring an inflection point from one or more vertical profiles of the plurality of cross-sections;

order the plurality of interpolation points in a downstream direction by locating a closest reach point for each point and sorting based on an index of a nearest point, wherein each interpolation point is sorted by increasing or decreasing order;

interpolate using a stream-bank constructor, a set of points on a curve corresponding to a bank on a side of the stream; and automatically interpolate until the index of the closest point on the reach to the starting point is also greater than or equal to the index of the closest point on the reach to the last interpolation point on the reach.

15. The system of claim 14, wherein the one or more processors are configured to:

assign bank interpolation points on the cross-sections where a channel ends and an overbank starts for both a left and a right over bank, and wherein the one or more processors are configured to generate flow-path lines that include flow-path interpolation points generated on the cross-section between a bank station and an end of the cross-section derived from a predetermined threshold between 0.0 and 1.0, wherein 0.0 identifies a location along the bank line and 1.0 is the location along the ends of the cross-section.

16. The system of claim 15, wherein the constructor, $y'=\beta\upsilon-\alpha\eta$, $y(0)=q_0$, is configured to determine a variable offset from the stream centerline along the generated cross-sections, wherein interpolating comprises the constructor that is configured to select points along the bank in a downstream direction as it nears the correct offset distance, moves either closer to the stream to match a correct offset distance, or further away from the stream to match the correct offset distance, and wherein functions for $\alpha$ and $\beta$ are defined in terms of a target offset distance $\Phi$ and an interpolation tolerance h, such that $$\Phi(y) = \frac{\sum_j \frac{\delta(q_i)}{\|y - q_i\|}}{\sum_j \frac{1}{\|y - 1_j\|}}, \text{ where } s = \delta(y) - \phi(y), h = 1, \text{ and}$$

$$\alpha = \frac{2}{1 + e^{-s/h}} - 1, \beta = e^{-\left(\frac{s}{h}\right)^2}.$$

17. A computer program product for tuning a one-dimensional hydraulic model of a stream network, comprising at least one non-transitory computer-readable medium including one or more instructions that, when executed by at least one processor, cause the at least one processor to:

obtain data including a stream network elevation for one or more streams, a plurality of centerlines, and flow information for the one or more streams in the stream network;

generate a plurality of discrete stream points, wherein each point corresponds to a point of a regular interval along a centerline of each stream in the stream network;

automatically generate a plurality of normal vectors of the stream network, each normal vector originating from a unique starting point selected from the plurality of discrete stream points;

generate a plurality of non-intersecting cross-sections in the stream network, each non-intersecting cross-section comprising a curve based on the flow information and originating from the one or more of the plurality of normal vectors, each non-intersecting cross-section configured to avoid intersection with each point in its own cross-section while avoiding intersection with points in each of an other non-intersecting cross-sections; and automatically adjust the plurality of non-intersecting cross-sections to satisfy a hydraulic modeling requirement wherein the curve corresponding to each cross-section passes through a unique point $p_j$ on the centerline of the stream network, and the one or more processors are configured to:

generate the curve for each non-intersecting cross-section by finding a solution, for each point $p_j$, to equation:

$$\frac{dy_j}{dt} = y'_j = \frac{f}{\|f\|}, \text{ where } y_j(0) = p_j;$$

wherein the vector field f(y) includes a sum over a plurality of points $p_i$ forming the centerline that are near to the curve based on a spatial indexing structure, and is computed by the equation:

$$f(y) = \sum_i \frac{n_i g_i}{d_i^2},$$

and determining $n_i$, $g_i$, and $d_i$ from:

$$n_i = \begin{bmatrix} \cos\left(\theta_i - \frac{\pi}{2}\right) \\ \sin\left(\theta_i - \frac{\pi}{2}\right) \end{bmatrix},$$

such that $\theta_i = \text{atan } 2 (\Delta p_{i,1}, \Delta p_{i,0})$ and $\Delta p_i = p_{i+1} - p_{i-1}$, and wherein $$g_i = \begin{cases} 1 & (u_i \times v_i)_2 \geq 0 \\ -1 & \text{otherwise} \end{cases}, \text{ when } u_i = \begin{bmatrix} y_0 - p_{i,0} \\ y_1 - p_{i,0} \\ 0 \end{bmatrix},$$

$$v_i = \begin{bmatrix} -n_{i,1} \\ n_{i,0} \\ 0 \end{bmatrix}, \text{ and } d_i = \|y - p_i\|;$$

and determine the normal vector in any of the discrete points of any stream or reach of the stream network, based on an angle formed in the change between a first point and a second point, wherein the discrete points change with respect to the angle of the stream.

\*  \*  \*  \*  \*